(12) United States Patent
Terada et al.

(10) Patent No.: US 6,998,857 B2
(45) Date of Patent: Feb. 14, 2006

(54) PROBE UNIT AND ITS MANUFACTURE

(75) Inventors: Yoshiki Terada, Hamamatsu (JP);
Shuichi Sawada, Hamamatsu (JP);
Atsuo Hattori, Iwata (JP)

(73) Assignee: Yamaha Corporation, Shizuoka-Ken (JP)

( * ) Notice: Subject to any disclaimer, the term of this patent is extended or adjusted under 35 U.S.C. 154(b) by 80 days.

(21) Appl. No.: 10/245,373

(22) Filed: Sep. 18, 2002

(65) Prior Publication Data

US 2003/0052703 A1    Mar. 20, 2003

(30) Foreign Application Priority Data

Sep. 20, 2001 (JP) ............................. 2001-287088
Jun. 5, 2002 (JP) ............................. 2002-164244
Jul. 15, 2002 (JP) ............................. 2002-205285

(51) Int. Cl.
*G01R 31/02* (2006.01)

(52) U.S. Cl. ............................................. 324/754
(58) Field of Classification Search .............. 324/754, 324/755, 751, 762, 760, 158.1; 438/17, 14, 438/18; 29/592.1, 593, 874
See application file for complete search history.

(56) References Cited

U.S. PATENT DOCUMENTS 4,038,599 A * 7/1977 Bove et al. ................. 324/754
6,531,327 B2 * 3/2003 Kanamaru et al. ............ 438/17

FOREIGN PATENT DOCUMENTS

| JP | 7-56493 | 6/1995 |
|----|---------|--------|
| JP | 7-283280 | 10/1995 |
| JP | 8-015318 | 1/1996 |
| JP | 8-110362 | 4/1996 |
| JP | 2552084 | 8/1996 |
| JP | 9-159696 | 6/1997 |
| JP | 10-339740 | 12/1998 |
| JP | 11-64425 | 3/1999 |
| JP | 11-337575 | 12/1999 |

OTHER PUBLICATIONS

Copy of Korean Office Action dated Dec. 20, 2004 (and English translation of same).

* cited by examiner

Primary Examiner—Ernest Karlsen
Assistant Examiner—Trung Q Nguyen
(74) *Attorney, Agent, or Firm*—Dickstein, Shapiro, Morin & Oshinsky, LLP.

(57) ABSTRACT

A probe unit to be fixed to a probe device for testing functions of a test body. The probe unit includes: a substrate; probe pins formed on the substrate by lithography, the probe pins having distal ends protruded from the substrate and being made in contact with electrodes of the test body; and a positioning member formed on the substrate by lithography at a predetermined position relative to the probe pins, the positioning means abutting upon a member for positioning the substrate relative to the probe device.

9 Claims, 35 Drawing Sheets

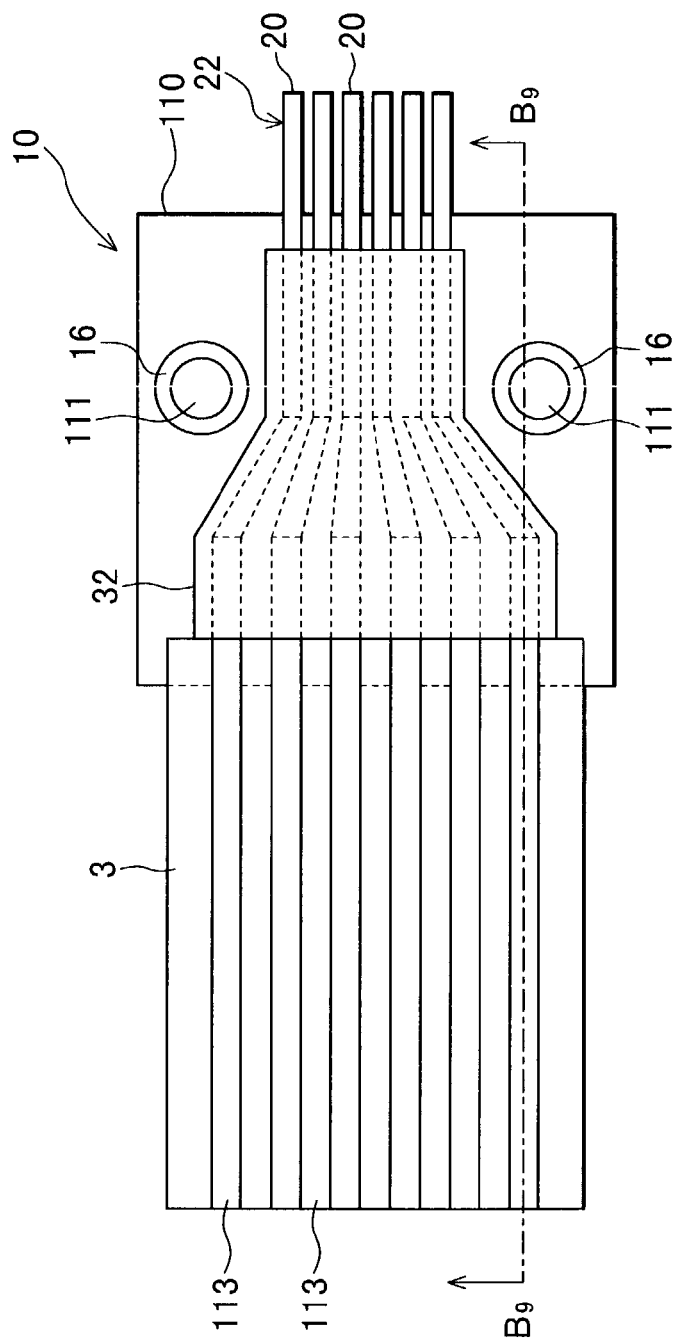
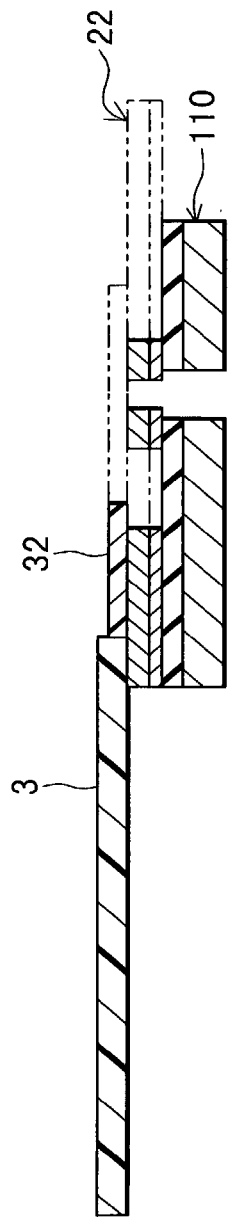
FIG.9A
FIG.9B

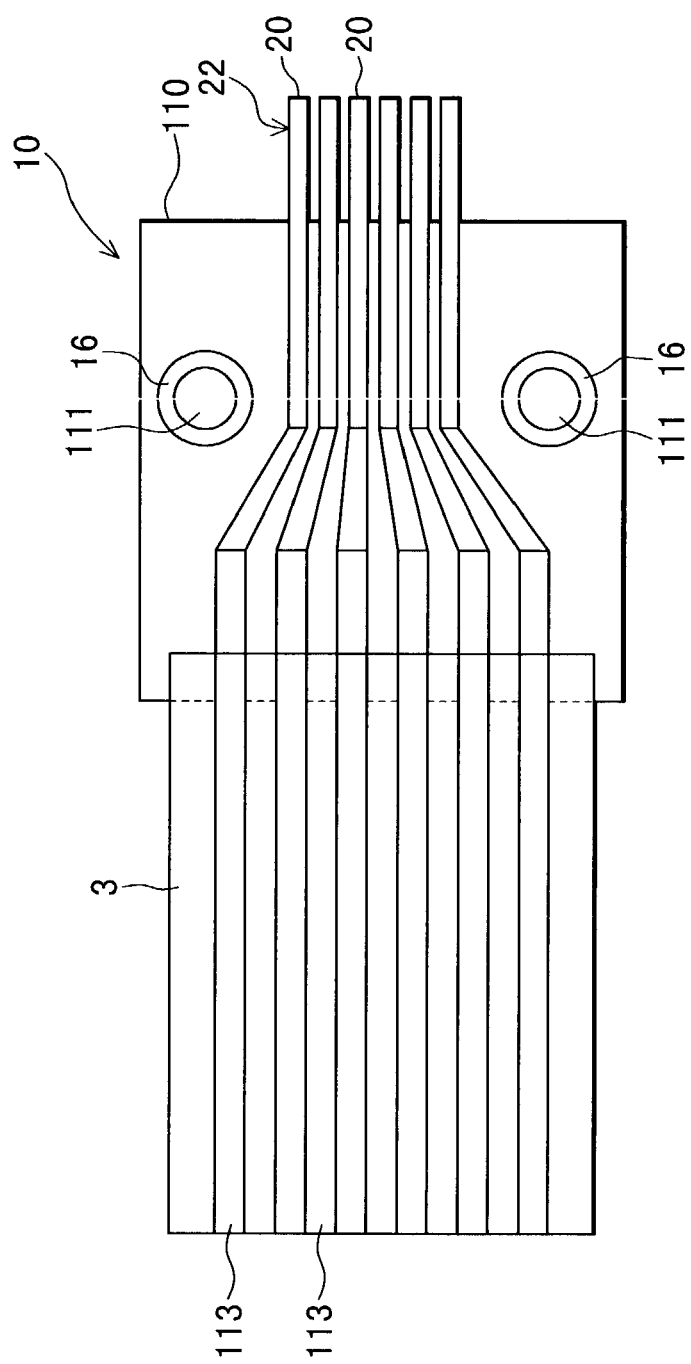
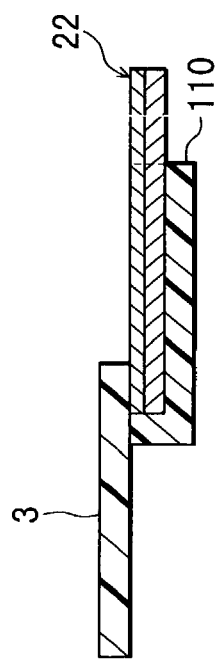
FIG.11A
FIG.11B

FIG.24JX
FIG.24JY
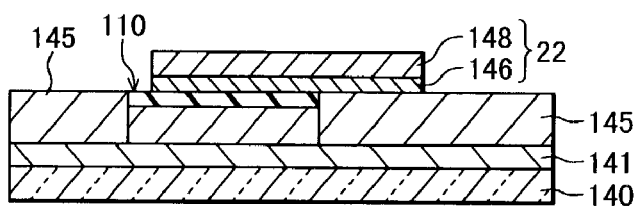
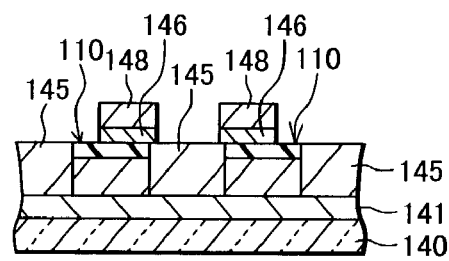
FIG.24KX
FIG.24KY
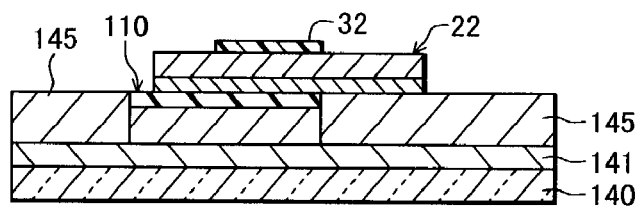
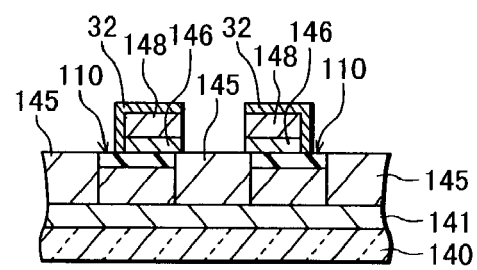
FIG.24LX
FIG.24LY
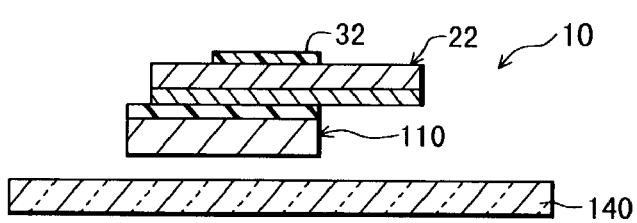
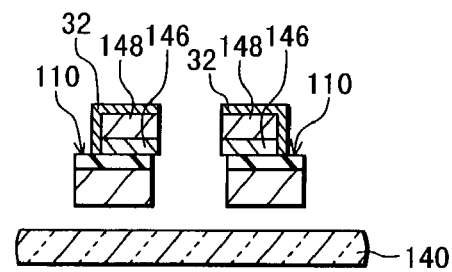

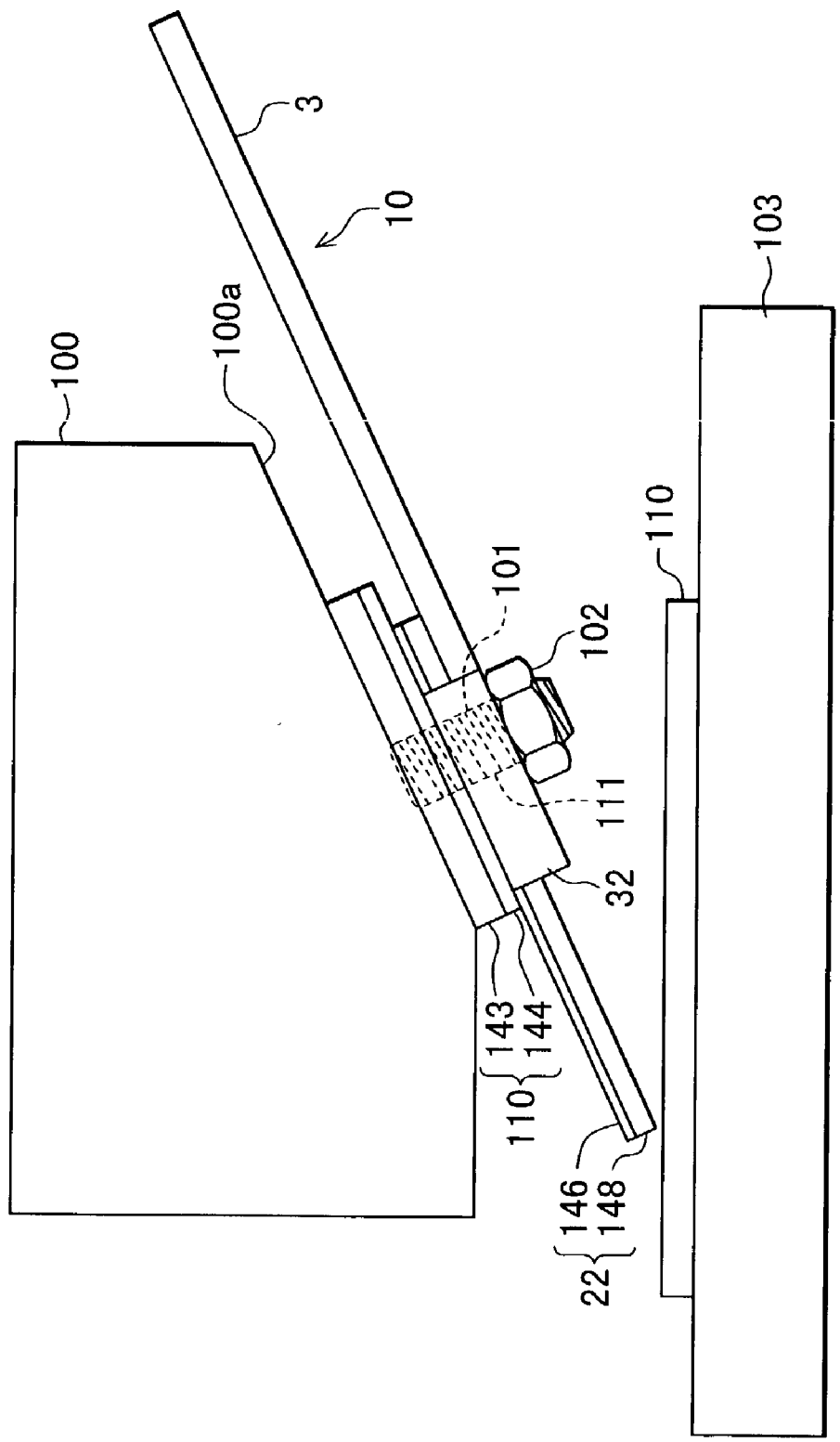

PROBE UNIT AND ITS MANUFACTURE

CROSS REFERENCE TO RELATED APPLICATION

This application is based on Japanese Patent Applications No. 2001-287088, filed on Sep. 20, 2001, No. 2002-164244, filed on Jun. 5, 2002, and No. 2002-205285, filed on Jul. 15, 2002, the entire contents of which are incorporated herein by reference.

BACKGROUND OF THE INVENTION

A) Field of the Invention

The present invention relates to a probe unit and its manufacture, the probe unit being used for conduction tests of electrodes, terminals and the like of an electronic device (test body) such as a semiconductor integrated circuit and a liquid crystal display panel.

B) Description of the Related Art

A conduction test is generally performed for products such as semiconductor integrated circuits, liquid crystal display panels and printed circuit boards in order to check whether these products can operate satisfactorily meeting the requirements of specifications.

During this conduction test, probe pins formed at or near at the tip of a probe unit are abutted upon juxtaposed electrodes of a semiconductor integrated circuit, a liquid crystal display panel, a printed circuit board or the like. Probe units to be used for conduction tests include an "independent wiring" type and a "plunger" type. Probe pins of a probe unit of the "independent wiring" type are made in contact with electrodes of a test body in one-to-one correspondence to establish independent conduction for each electrode. Probe pins of a probe unit of the "plunger" type are intended to be in contact with a plurality of electrodes of a test body at the same time.

Electrode layers are juxtaposed nowadays at a microfine pitch along the edge of a glass plate constituting a liquid crystal display panel. In order to perform a conduction test for such a liquid crystal display panel, the conduction test apparatus is required to have a probe unit whose probe pins are compatible with the microfine pitch of the electrode layers.

The pitch of electrode layers is 0.1 mm or smaller. It is difficult to form a probe unit compatible with such a pitch through mechanical punching.

Probe units are therefore manufactured by etching or plating.

A method of manufacturing a probe unit of the independent wiring type is disclosed, for example, in the Japanese Patent Publication No. 2552084.

This Publication proposes to adhere a number of leads whose workpiece is coupled by tie bars and cut the tie bars after adhesion.

A method of manufacturing a probe unit of the independent wiring type is disclosed also in JP-B-7-56493. This Publication proposes to etch conductive contact terminals into a predetermined shape and layout, adhere the conductive contact terminals to an insulating member, and thereafter cut both ends of the conductive contact terminals.

Another method of manufacturing a probe unit of the independent wiring type is disclosed in JP-A-11-337575. This Publication proposes to coat resist on a plated metal layer to a desired thickness, set a mask having a predetermined pattern to the resist surface, perform exposure and development processes to remove unnecessary resist, deposit thin plated copper seed layers on the exposed plated metal layer, grow probe pins having a desired thickness on the seed layer, and dissolve only the copper seed layer to separate the probe pins. This Publication further proposes to form holes through a substrate with a drill or a laser and fit positioning projections formed on the probe pins into the holes to fix the probe pins to the substrate.

Probe units of the "plunger" type are proposed in JP-A-8-110362 and JP-A-11-64425.

Narrow pitches of electrodes of a test body and probe pins make it difficult to realize position alignment between the electrodes and probe pins. JP-A-10-339740 discloses a method of positioning and fixing a probe unit (contact probe) having probe pins formed on a substrate (film) to a probe device.

With the method described in Japanese Patent Publication No. 2552084, however, it is very difficult to adhere leads to an insulating base at a high precision of position alignment. In addition, when tie bars are cut, leads may be damaged.

With the method described in JP-B-7-56493, it is very difficult to adhere conductive contact terminals to the insulating member at a high precision of position alignment.

With the method described in JP-A-11-337575, the thin plated copper seed layer has a small contact area with solvent so that it is hard to dissolve the seed layer and it takes a long time to separate the probe pins. It is also difficult to form holes through a substrate with a drill or a laser at a high precision and to dispose the probe pins at positions corresponding to the holes.

With the method disclosed in JP-A-10-339740, positioning holes for positioning and fixing a probe unit to a probe device are formed through a substrate by a process different from the lithography process of forming probe pins. It is therefore difficult to realize a high position alignment precision between probe pins and positioning holes. It is therefore difficult to obtain sufficiently high position precision between the probe device and probe pins and between electrodes of a test body held by the probe device and probe pins.

SUMMARY OF THE INVENTION

An object of this invention is to provide a probe unit having probe pins disposed on a substrate at a high precision and positioning holes formed through the substrate at a high precision for mounting the probe unit to an apparatus, and provide a probe unit manufacture method.

According to one aspect of the present invention, there is provided a probe unit to be fixed to a probe device for testing functions of a test body, comprising: a substrate; probe pins formed on the substrate by lithography, the probe pins having distal ends protruded from the substrate and being made in contact with electrodes of the test body; and a positioning member formed on the substrate by lithography at a predetermined position relative to the probe pins, the positioning means abutting upon a member for positioning the substrate relative to the probe device.

The positioning member abuts upon a member for positioning the substrate relative to the probe device so that the substrate is positioned and fixed to the probe device by using the positioning member as a position reference. The positioning member is positioned on the substrate relative to the probe pins by using lithography so that the probe pins can be positioned relative to the probe device at a high precision. The position precision of the probe pins of the probe unit relative to electrodes of a test body can therefore be improved. A light source or radiation source used for exposure and transfer of lithography are not limited. Lithography may be photolithography, UV lithography, ion beam lithography or the like.

The positioning member may have the inner clip washer shape that elastic protrusions extend circumferentially around a through hole formed through the substrate. By pressure-fitting a member for positioning the substrate relative to the probe device into the positioning member having the inner clip washer shape, the position precision of the probe pins relative to the probe device can be improved further because of a centering function of the positioning member.

The probe unit may further include a reinforcing film fixed to the substrate and covering the probe pins on the substrate and/or at least a region of the positioning member. This reinforcing film prevents the probe pins and/or positioning member from being separated from the substrate. In this specification, "the probe pins on the substrate and/or at least a region of the positioning member" is intended to mean at least one of "the probe pins on the substrate" and "at least a region of the positioning member".

It is preferable that the probe pins and the positioning member are made of a same material and have a same film thickness.

According to another aspect of the invention, there is provided a probe unit to be fixed to a probe device for testing functions of a test body, comprising: probe pins including an underlying film and a probe pin pattern formed on the underlying film; and a probe holder formed on a top surface defined by ends of the probe pins and having a plurality of small holes.

Since a plurality of small holes are formed through the probe holder, a contact area of etchant for removing a target layer can be broadened. It is preferable that the probe holder is made of a plated layer formed in a frame defined by a resist film.

It is preferable that an insulating film is formed on the surface of the probe holder and that the probe pins are formed on the surface of the insulating film.

It is preferable that a protective film covers the probe holder and the probe pins.

It is preferable that the probe pins made of the same material as the probe holder are formed on the surface of the probe holder made of a plated layer.

It is preferable that the probe pin made of a plated layer is embedded in the probe holder made of resin.

According to another aspect of the invention, there is provided a method of manufacturing a probe unit to be fixed to a probe device for testing functions of a test body, the method comprising a step of forming probe pins having distal ends protruded from a substrate and being made in contact with electrodes of the test body, and a positioning member for abutting upon a member for positioning the substrate relative to the probe device, respectively on the substrate at the same time by lithography.

Since the probe pins and positioning member are formed at the same time by lithography, a position precision of relative positions of the probe pins and positioning member can be improved. As the substrate is positioned and fixed to the probe device by using the positioning member as a position reference, the probe pins are positioned on the probe device at a high precision. According to the probe unit manufacture method, a position precision of the probe pins relative to electrodes of the test body can be improved.

According to another aspect of the invention, there is provided a method of manufacturing a probe unit to be fixed to a probe device for testing functions of a test body, the method comprising: a step of forming an alignment mark on a substrate; a step of forming probe pins having distal ends protruded from the substrate and being made in contact with electrodes of the test body, on the substrate by lithography by using the alignment mark as a position reference; and a step of forming a positioning member for abutting upon a member for positioning the substrate relative to the probe device, on the substrate by lithography by using the alignment mark as a position reference.

Since the probe pins and positioning member are formed by lithography by using the common alignment mark as a position reference, a position precision of relative positions of the probe pins and positioning member can be improved. As the substrate is positioned and fixed to the probe device by using the positioning member as a position reference, the probe pins are positioned on the probe device at a high precision. According to the probe unit manufacture method, a position precision of the probe pins relative to electrodes of the test body can be improved. Either the process of forming the probe pins or the process of forming the positioning member may be performed first after the alignment mark is formed.

According to another aspect of the invention, there is provided a method of manufacturing a probe unit to be fixed to a probe device for testing functions of a test body, the method comprising: a step of forming probe pins having distal ends protruded from the substrate and being made in contact with electrodes of the test body and an alignment mark, on a substrate at the same time by lithography; and a step of forming a positioning member for abutting upon a member for positioning the substrate relative to the probe device, on the substrate by lithography by using the alignment mark as a position reference.

Since the positioning member is formed by using as a position reference the alignment mark formed at the same time when the probe pins are formed, a position precision of relative positions of the probe pins and positioning member can be improved. As the substrate is positioned and fixed to the probe device by using the positioning member as a position reference, the probe pins are positioned on the probe device at a high precision. According to the probe unit manufacture method, a position precision of the probe pins relative to electrodes of the test body can be improved.

According to another aspect of the invention, there is provided a method of manufacturing a probe unit to be fixed to a probe device for testing functions of a test body, the method comprising: a step of forming a positioning member for abutting upon a member for positioning a substrate relative to the probe device and an alignment mark, on the substrate at the same time by lithography; and a step of forming probe pins having distal ends protruded from the substrate and being made in contact with electrodes of the test body, on the substrate by lithography by using the alignment mark as a position reference.

Since the probe pins are formed by using as a position reference the alignment mark formed at the same time when the positioning member is formed, a position precision of relative positions of the probe pins and positioning member can be improved. As the substrate is positioned and fixed to the probe device by using the positioning member as a position reference, the probe pins are positioned on the probe device at a high precision. According to the probe unit manufacture method, a position precision of the probe pins relative to electrodes of the test body can be improved.

According to another aspect of the invention, there is provided a method of manufacturing a probe unit, comprising: a step of forming a sacrificial film on a surface of a substrate; a step of forming an underlying film on a surface of the sacrificial film; a step of forming a resist film having openings corresponding to a probe unit pattern and including at least one small hole, on a surface of the underlying film; a step of forming the probe unit pattern in the openings of the resist film by plating, the probe unit pattern including probe pins and a probe holder; a step of removing the resist film and the underlying film under the resist film; and a step of removing the sacrificial film to obtain a probe unit.

According to another aspect of the invention, there is provided a method of manufacturing a probe unit, comprising: a step of forming a sacrificial film on a surface of a substrate; a step of forming a first resist film on a surface of the sacrificial film, the first resist film having an opening corresponding to a probe holder pattern; a step of forming the probe holder pattern in the opening of the first resist film by plating; a step of forming an insulating film on a surface of the probe holder pattern; a step of removing the first resist film to obtain a probe holder; a step of forming a metal layer on the surface of the sacrificial film where the probe holder is not formed, by plating; a step of forming an underlying film on surfaces of the insulating film and the metal layer; a step of forming a second resist film on a surface of the underlying film, the second resist film having openings corresponding to a probe pin patter; a step of forming the probe pin pattern in the openings of the second resist film by plating; a step of removing the second resist pattern; and a step of removing the sacrificial film under the second resist film to obtain a probe unit.

According to another aspect of the invention, there is provided a method of manufacturing a probe unit, comprising: a step of forming a sacrificial film on a surface of a substrate; a step of forming a first underlying film on a surface of the sacrificial film; a step of forming a first resist film having openings corresponding to a probe pin pattern on a surface of the first underlying film; a step of forming the probe pin pattern in the openings of the first resist film by plating; a step of removing the first resist film to obtain the probe pin pattern; a step of covering the probe pin pattern with a plated layer, polishing a surface of the plated layer to make a surface of the plated layer be flush with a surface of the probe pin pattern, and thereafter forming an insulating film on the surfaces of the plated layer and the probe pin pattern; a step of forming a second underlying film on a surface of the insulating film; a step of forming a second resist film on a surface of the second underlying film, the second resist film having an opening corresponding to a probe holder pattern having at least one small hole; a step of forming the probe holder pattern in the opening of the second resist film by plating; and a step of removing the second resist film, the second underlying film, the insulating film, the plated layer and the sacrificial film to obtain a probe unit.

The probe unit can be mounted on each of various apparatuses such as test bodies at a high precision of position alignment. A conduction test for a liquid crystal display panel or the like can be performed at a high precision. Since a pattern for determining a mount position and probe pins can be formed at the same time, positioning holes can be formed at a high precision. A precision of relative positions of the probe pins and a test body can be improved.

According to the probe unit manufacture method, a probe unit can be manufactured which has probe pins, a probe holder and positioning holes for mounting the probe unit on each of various apparatuses, respectively disposed at a high position precision.

BRIEF DESCRIPTION OF THE DRAWINGS

FIGS. 9A and 9B are a plan view and a cross sectional view showing a seventh structure of a probe unit.

FIGS. 11A and 11B are a plan view and a cross sectional view showing a ninth structure of a probe unit.

FIG. 28 is a front view illustrating how a probe unit manufactured by the embodiment method is used.

DESCRIPTION OF THE PREFERRED EMBODIMENTS

Figure 1:
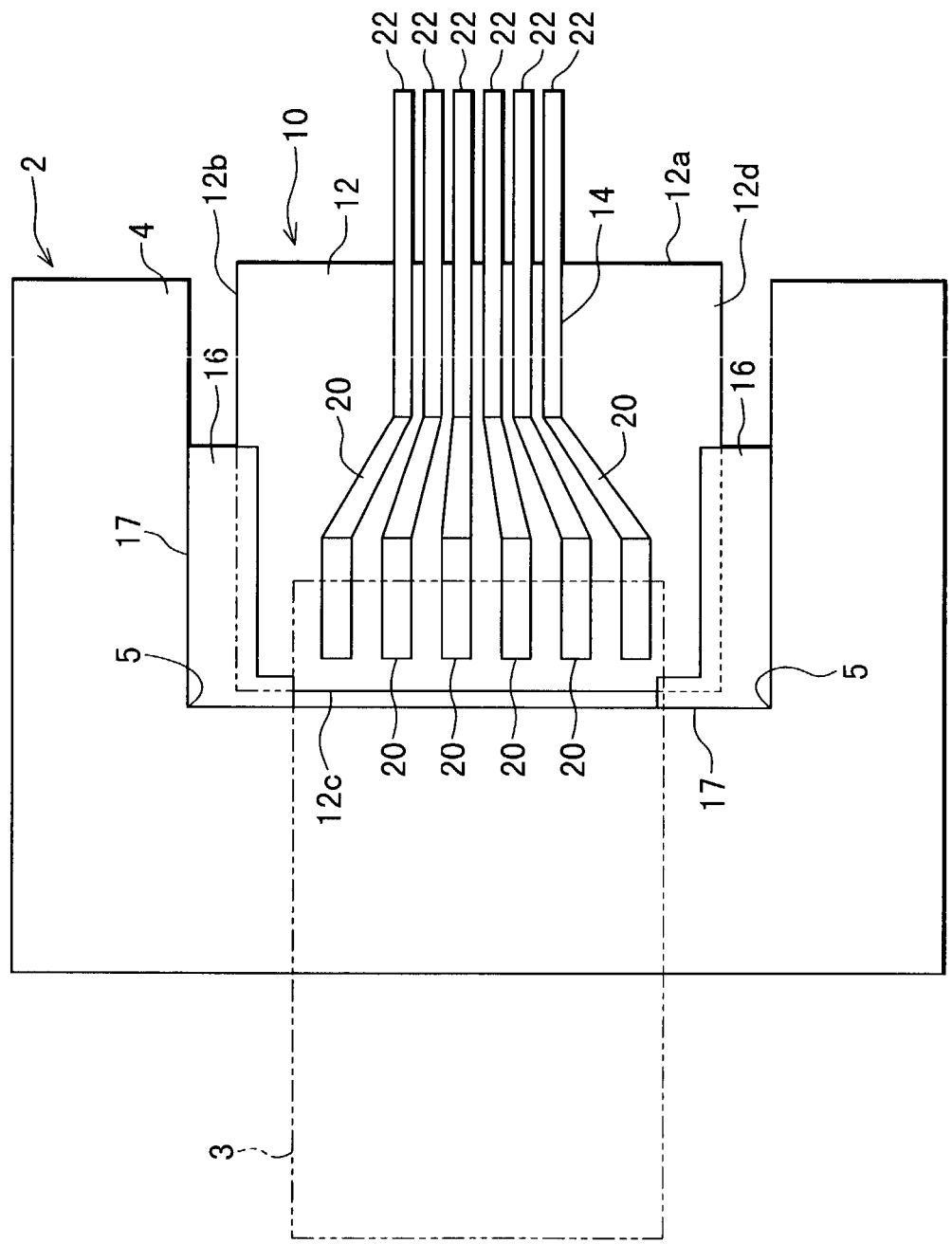
FIG. 1 is a plan view showing a first structure of a probe unit.

Description will be made on the preferred embodiments of the invention, referring to the drawings. Probe units according to the embodiments of the invention will be described. First to fifth structures of a probe unit 10 shown in FIGS. 1 to 5B will be described first. The probe unit 10 has a lead pattern 14 and positioning members 16 formed on a substrate 12. The probe unit 10 is fixed to a probe device 2 positioned above a test body base (sample base). In the examples shown in FIGS. 1 to 5B, although one probe unit 10 is fixed to the probe device 2, the number of probe units to be fixed to the probe device 2 is determined depending upon the structure of a test body. For example, four probe units may be fixed radially at a pitch of 90° to a probe device.

The substrate 12 is made of generally a rectangular plate. Material of the substrate 12 may be insulating material such as glass ceramic, quartz, zirconia, glass, alumina and synthetic resin, or conductive material such as iron-nickel alloy, copper, stainless steel, silicon, silicon carbide and AlTiC.

The lead pattern 14 is constituted of a plurality of leads 20 formed on the surface of the substrate 12. The leads 20 may be mutually conductive or not mutually conductive. The leads 20 are formed on the substrate 12 by lithography in position alignment with one another. A flexible printed wiring flat cable 3 is electrically connected to proximal sides of the leads 20. The distal sides of the leads 20 constitute probe pins 22. These probe pins 22 are disposed at a uniform pitch and extend linearly in parallel. Material of the lead 20 may be metal such as nickel alloy and nickel.

The positioning members 16 are formed on the surface of the substrate 12 by lithography in position alignment with the probe pins 22 of the lead pattern 14. The positioning members 16 abut upon a fixing jig 4 of the probe device 2. Similar to the lead 22, the positioning member 16 is made of metal such as nickel alloy and nickel. As compared to synthetic resin such as polyimide, metal has a good shape stability and is less deformed by temperature or humidity. Abutment of the positioning members 16 upon the fixing jig 4 determines the position of the substrate 12 relative to the probe device 2. The fixing jig 4 constitutes "a member for positioning the substrate relative to the probe device".

The first to fifth structures of the probe unit 10 will be described in detail.

(First Structure)

Figure 6:
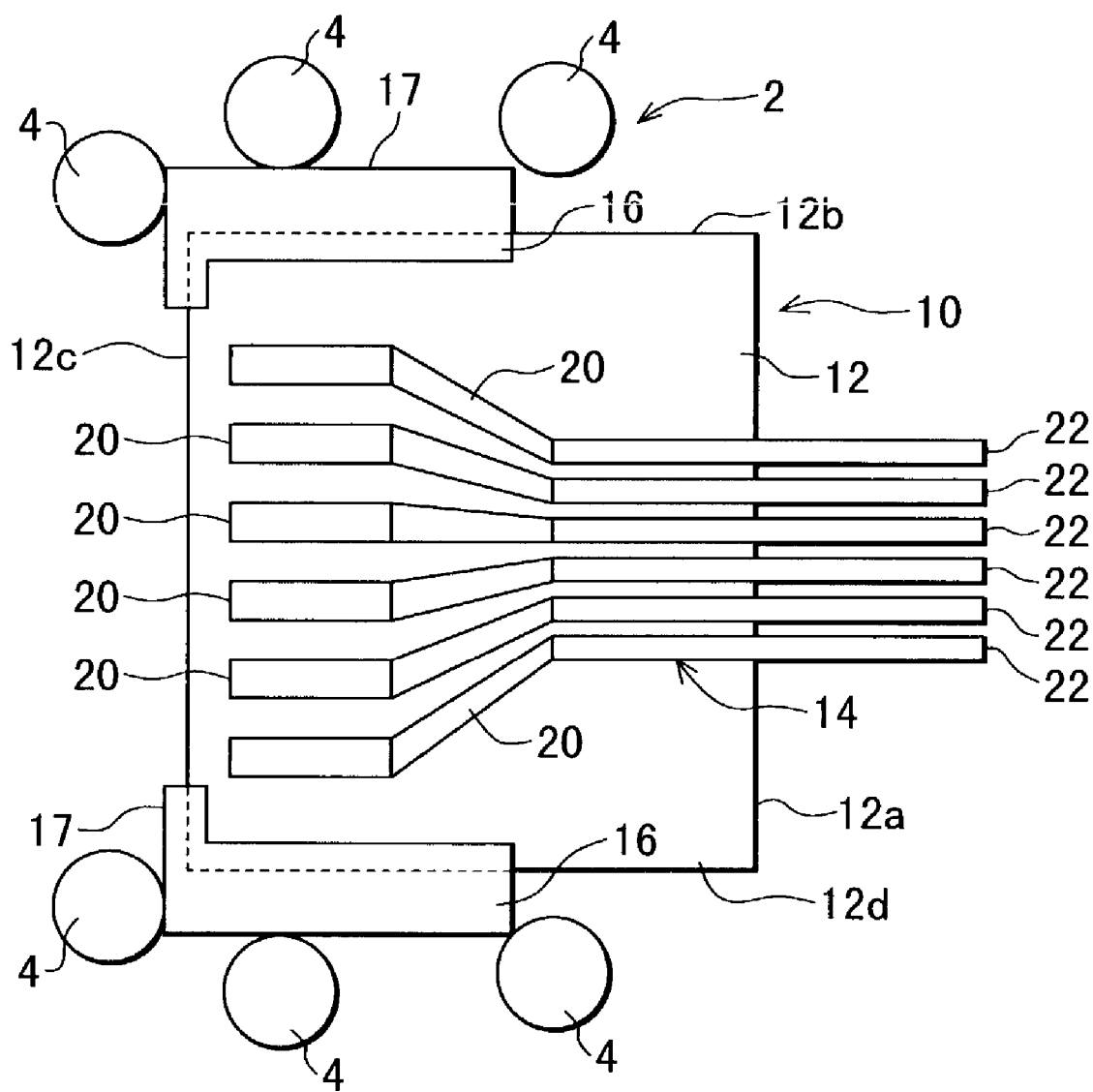
FIG. 6 is a plan view showing a modification of the probe unit shown in FIG. 1.

In the first structure shown in FIG. 1, the probe pin 22 on the distal side of each lead protrudes from one side 12a of the substrate 12. The positioning member 16 has an L-character shape extending along a side 12b perpendicular to the side 12a from which the probe pins 22 protrude and along a side 12c opposing the side 12a, and protrudes from the sides 12b and 12c. The other positioning member 16 has also an L-character shape extending along another side 12d perpendicular to the side 12a from which the probe pins 22 protrude and along the side 12c opposing the side 12a, and protrudes from the sides 12d and 12c. The sides 17 of each positioning member 16 on the outer side of the substrate 12 abut upon the corner 5 of the fixing jig 4 having a U-character shape. The substrate 12 is therefore fixed relative to the extension direction of the probe pins 22 and the direction perpendicular to the extension direction. As shown in FIG. 6, a plurality of columnar (cylindrical in FIG. 6) fixing jigs 4 may be formed to abut the outer wall of the fixing jigs 4 upon the positioning member 16 at a plurality of positions.

(Second Structure)

Figure 2:
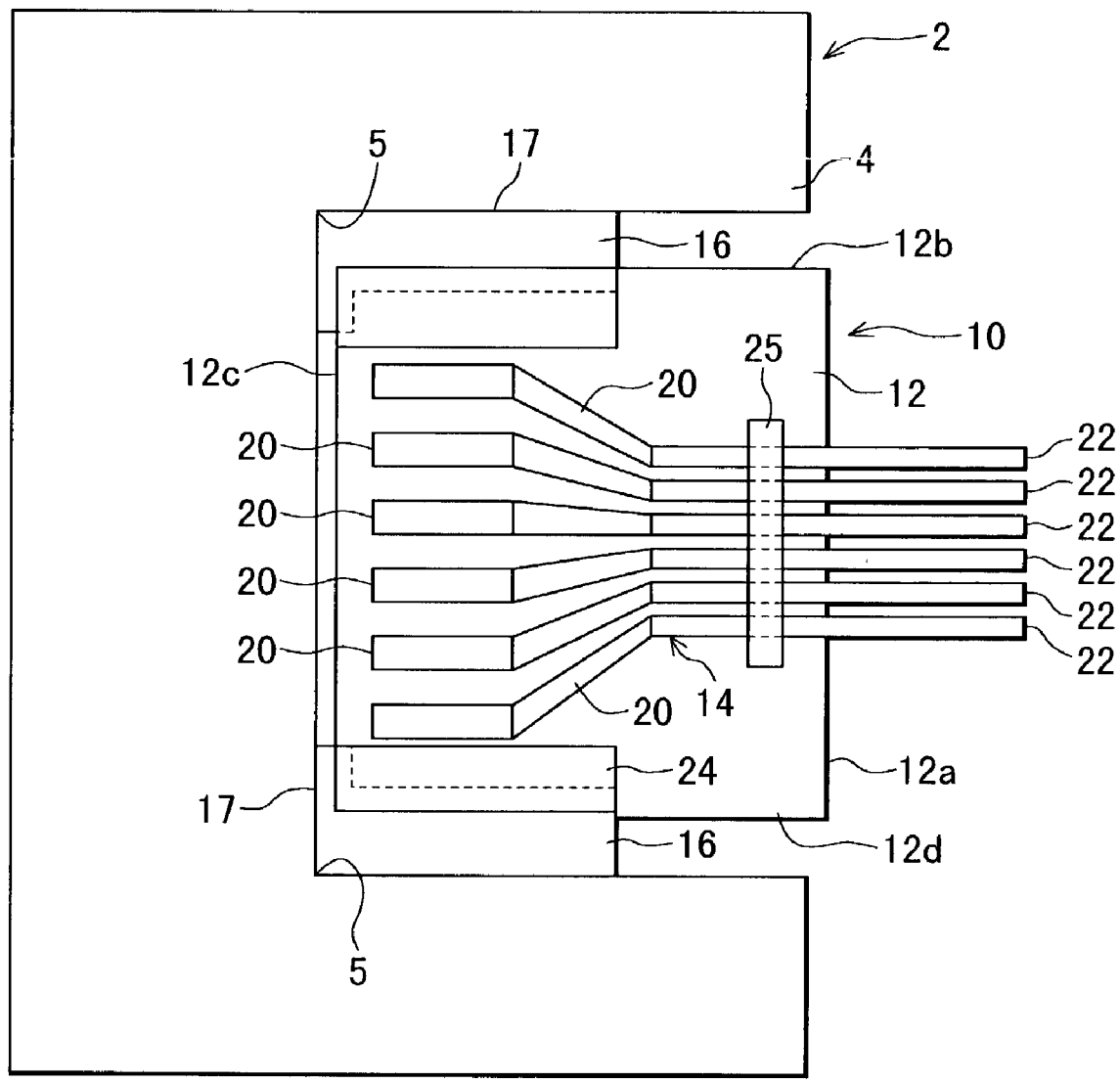
FIG. 2 is a plan view showing a second structure of a probe unit.
Figure 7:
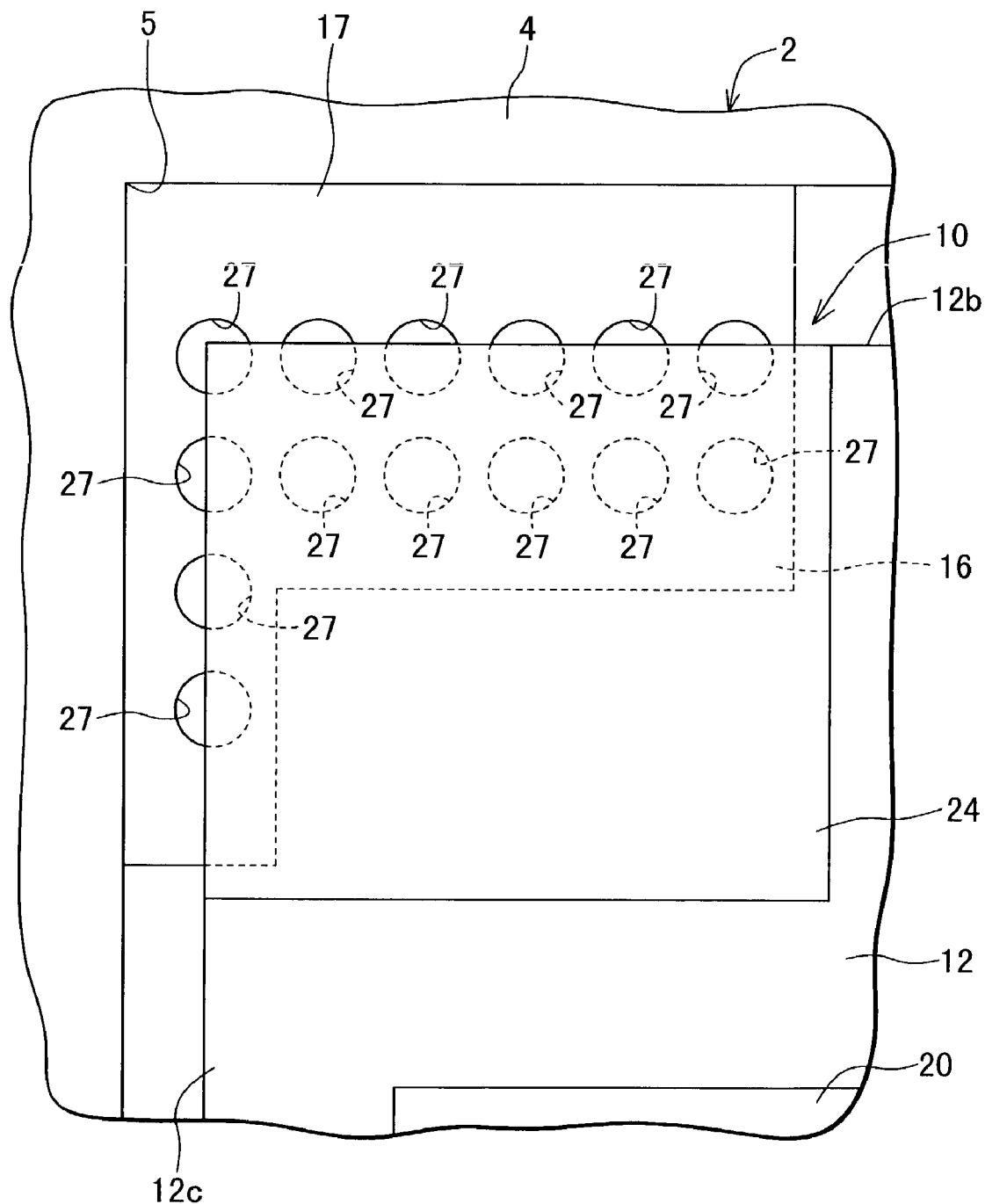
FIG. 7 is a plan view showing a modification of the probe unit shown in FIG. 2.

In the second structure shown in FIG. 2, in addition to the first structure, a reinforcing film 24 covering the partial surface of the positioning member 16 and fixed to the substrate 12 and a reinforcing film 24 covering the base portions of the probe pins 22 are formed. Material of the reinforcing films 24 and 25 is synthetic resin or the like. The reinforcing film 24 prevents the positioning member 16 from being separated from the substrate 12 by an external force applied to the outer sides of the positioning member 16. The reinforcing film 25 prevents the probe pins 22 from being separated from the substrate 12 by an external force. Not both the films 24 and 25 but one of the reinforcing film 24 covering the positioning member 16 and the reinforcing film 25 covering the base portions of the probe pins 22 may be used. A reinforcing film covering the positioning members 16 and base portions of the probe pins 22 may be formed. As shown in FIG. 7, a plurality of holes may be formed through the positioning member 16 and filled with the same material as that of the reinforcing film 24 to further strengthen the reinforcing film 24.

(Third Structure)

Figure 3A:
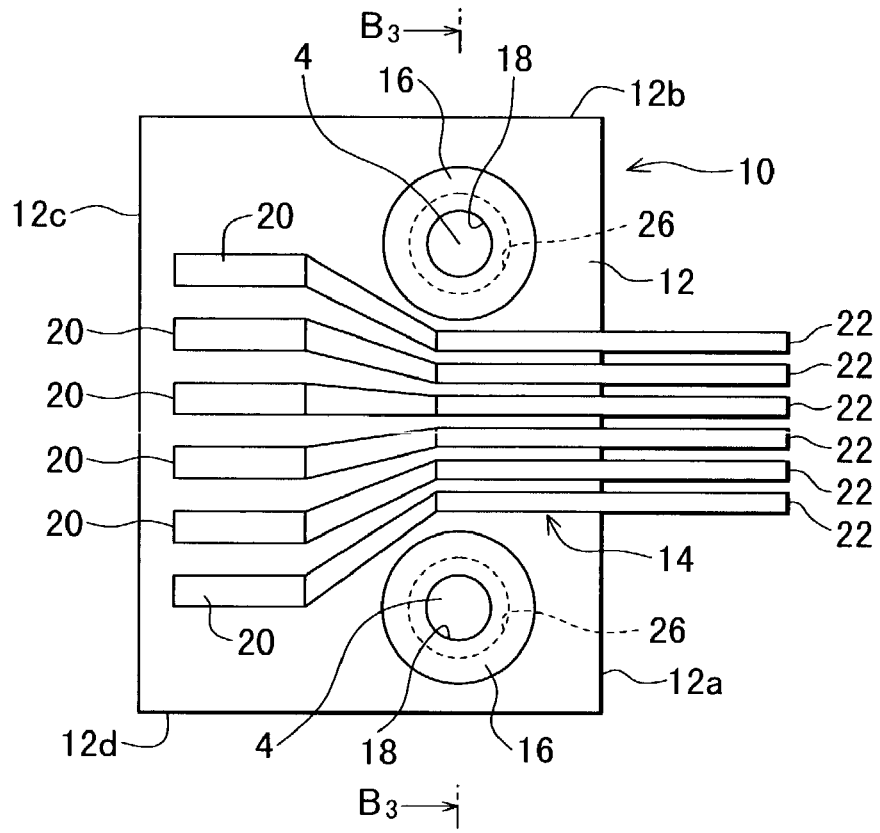
FIGS. 3A and 3B are a plan view and a cross sectional view showing a third structure of a probe unit.
Figure 3B:
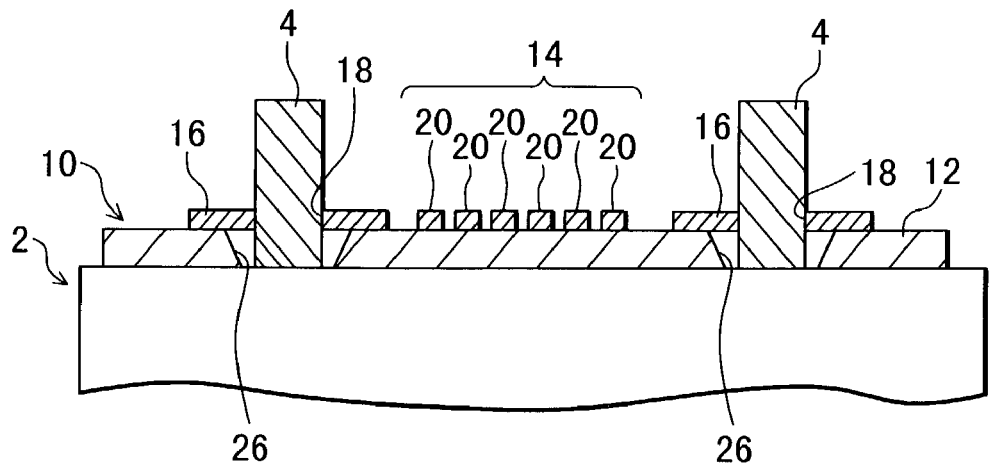

FIG. 3A is a plan view showing the third structure of the probe unit 10, and FIG. 3B is a cross sectional view of the probe unit 10 taken along line $B_3$—$B_3$ line shown in FIG. 3A. In the third structure, the positioning member 16 and the fixing jig 4 abutting upon the positioning member 16 are different from the first structure. The positioning members 16 of a ring shape are formed on both sides of the lead pattern 14 and overlap through holes 26 formed through the substrate 12. The positioning member 16 is made of the same material and has the same thickness as the lead pattern 14. The diameter of the hole of the positioning member 16 is smaller than the diameter of the through hole 26. The inner wall 18 of the hole of the positioning member 16 rides over the opening of the through hole 26. The fixing jig 4 of a cylindrical shape is fitted into the hole of the positioning member 16 so that the substrate 12 is fixed omnidirectionally.

(Fourth Structure)

Figure 4A:
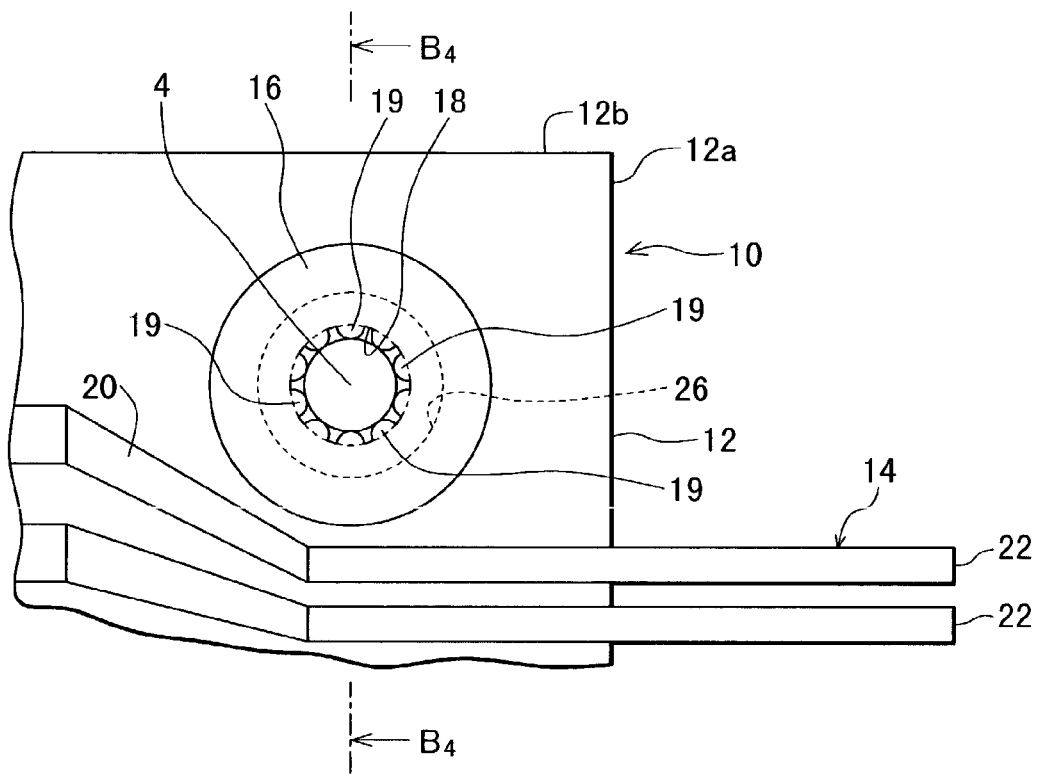
FIGS. 4A and 4B are a plan view and a cross sectional view showing a fourth structure of a probe unit.
Figure 4B:
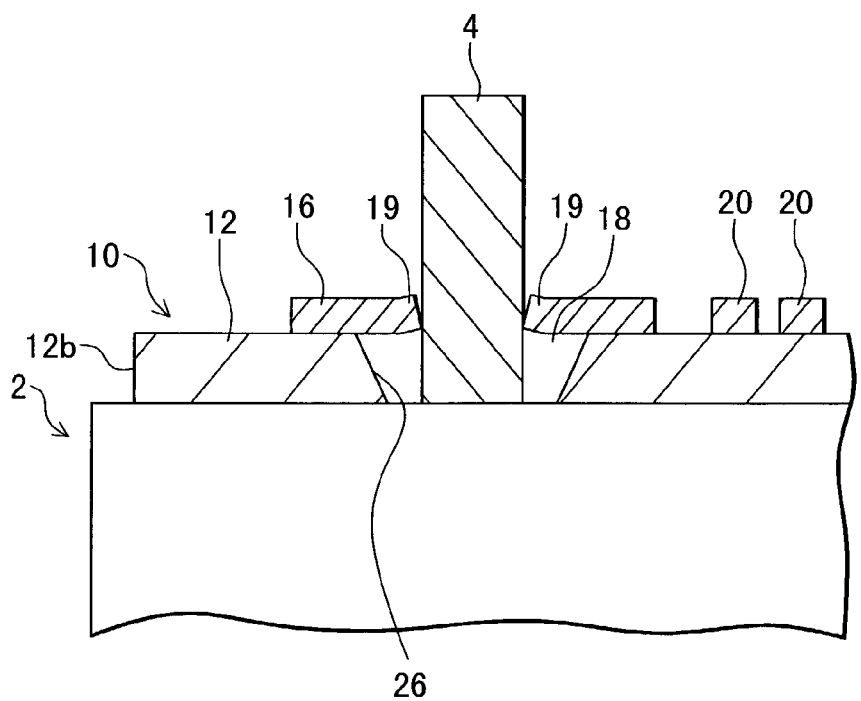

FIG. 4A is a plan view showing the fourth structure of the probe unit 10, and FIG. 4B is a cross sectional view of the probe unit 10 taken along line $B_4$—$B_4$ line shown in FIG. 4A. In the fourth structure, the shape of the positioning member 16 is different from the third structure. The positioning members 16 has such an inner clip washer shape as protrusions extending from the inner circumference side 18 to the radially inner side are disposed circumferentially. It is preferable that the protrusions 19 are disposed circumferentially at an equal pitch. As shown in FIG. 4B, as the cylindrical fixing jig 4 is fitted into the hole of the positioning member 16, each protrusion is elastically deformed toward the fitting direction. This deformation absorbs manufacturing tolerances of the hole diameter of the positioning member and the outer diameter of the fixing jig 4 so that the positioning member 16 is centered at high precision relative to the fixing jig 4.

(Fifth Structure)

Figure 5A:
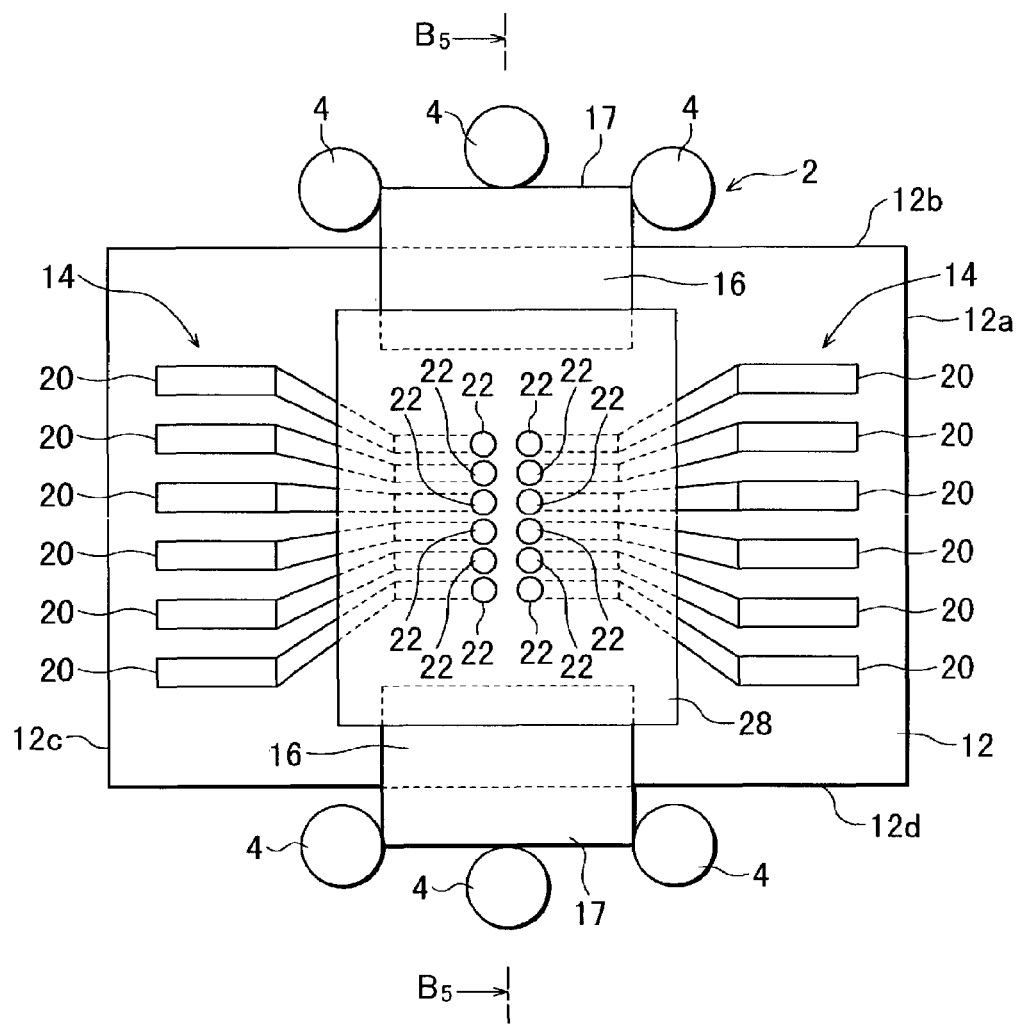
FIGS. 5A and 5B are a plan view and a cross sectional view showing a fifth structure of a probe unit.
Figure 5B:
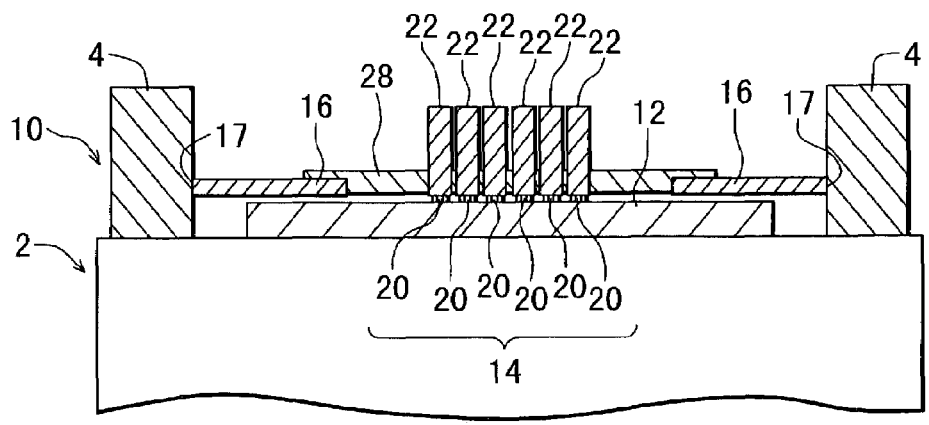

FIG. 5A is a plan view showing the fifth structure of the probe unit 10, and FIG. 5B is a cross sectional view of the probe unit 10 taken along line $B_5$—$B_5$ line shown in FIG. 5A. In the fifth structure, two axisymmetric lead patterns 14 are formed on the substrate 12. The probe pins 22 of the leads 20 constituting each lead pattern 14 have a rod shape vertically projecting from the surface of the substrate 12. Rectangular positioning members 16 are formed along sides 12b and 12d on opposite sides of columns of the probe pins 22 of the lead patterns 14. The positioning members 16 protrude from the corresponding sides 12b and 12d. The sides 17 of the positioning members 16 are parallel to the sides 12b and 12d. The side 17 of each positioning member 16 abuts upon the outer circumferences of a plurality of fixing jigs 4 having a columnar (cylindrical in FIGS. 5A and 5B) shape. The substrate 12 is therefore fixed to the probe device 2. A reinforcing film 28 fixed to the substrate 12 covers the base portions of the probe pins 22 and the partial surfaces of the positioning members 16. Material of the reinforcing film 28 is synthetic resin or the like. The reinforcing member 28 prevents the probe pins 22 and the positioning members 16 from being separated from the substrate 12 by an external force applied to the probe pins and the sides 17 of the positioning members 16.

In the fifth structure, although the height (film thickness) of the positioning member 16 is set lower than the height of the probe pin 22 as shown in FIG. 5B, the height of the positioning member 16 may be set higher than the probe pin 22. In this case, the side 17 of the positioning member 16 is prevented from being broken by an external force.

(Sixth Structure)

Figure 8A:
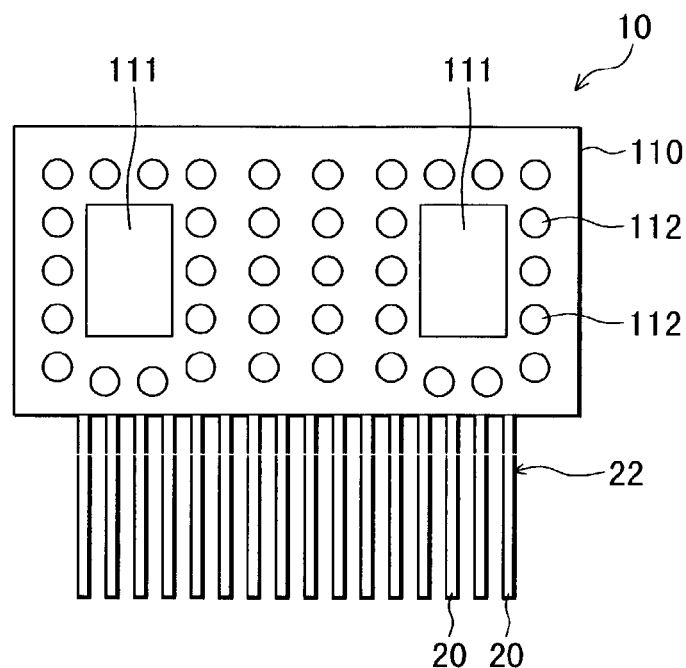
FIGS. 8A to 8C are plan views showing a sixth structure of a probe unit.

FIG. 8A is a plan view showing the sixth structure of the probe unit 10. In the sixth structure, comb-shaped probe pins 22 of a number of leads 20 juxtaposed highly precisely at a narrow pitch and a probe holder 110 joined to one ends of the probe pins 22 are integrally formed. The probe pins 22 and probe holder 110 are flush with the same plane. The probe pins 22 and probe holder 110 are made of the same material such as nickel alloy formed by plating.

The probe pins 22 and probe holder 110 of the probe unit of the sixth structure are made of the same metal so that the leads 20 are mutually conductive. The probe unit of the sixth structure is suitable for a plunger type probe unit which performs a conduction test of a plurality of electrodes of the same device such as a liquid crystal display panel at the same time.

Positioning holes 111 may be formed through the probe holder 110 to mount the probe unit 10 on each apparatus in position alignment. The size, shape, position of the positioning hole 111 are determined depending upon each apparatus on which the probe unit 10 is mounted. For example, instead of forming a plurality of polygonal holes such as shown in FIG. 8A, a single polygonal hole capable of preventing rotation or a plurality of circular holes may be formed (refer to FIG. 8B), or ellipsoidal holes capable of adjusting a mount position may be formed (refer to FIG. 8C).

The position of each positioning hole 111 is determined highly precisely by using photoresist so that the probe unit 10 can be mounted on each apparatus in high precision position alignment. It is therefore possible to highly precisely perform conduction tests of liquid crystal display panels and the like.

A number of small holes 112 may be formed through the probe holder 110. As will be later described, in a method of manufacturing a probe unit of the sixth structure, a sacrificial film is dissolved by etchant to separate an integrated part of a metal foil and an underlying film from a substrate. The small holes 112 are used for making large the contact area between the sacrificial film and etchant. Although the positions, size and number of small holes 112 are not limited specifically, it is preferable to form the small holes 112 in such a manner that etchant uniformly contacts the whole surface of the sacrificial film under the underlying film. A dissolution time of the sacrificial film can be shortened considerably.

(Seventh Structure)

FIG. 9A is a plan view showing the seventh structure of the probe unit 10, and FIG. 9B is a cross sectional view of the probe unit 10 taken along line $B_9$—$B_9$ line shown in FIG. 9A.

This probe unit 10 has a probe holder 110 and comb-shaped probe pins 22 formed on the distal side of a number of leads 20 highly precisely juxtaposed at a narrow pitch. The probe pins 22 are stacked upon the probe holder 110 and integrated therewith. To this probe unit 10, a flexible printed wiring flat cable 3 is joined which has a number of electrodes 113 disposed parallel at a narrow pitch. The probe unit 10 and flexible printed wiring flat cable 3 are joined together with each pair of a lead 20 and an electrode 113 being electrically connected.

Positioning holes 111 may be formed through the probe holder 110 to mount the probe unit 10 on each apparatus in position alignment. The size, shape, position of the positioning hole 111 are determined depending upon each apparatus on which the probe unit 10 is mounted. The position of each positioning hole 111 is determined highly precisely by using photoresist so that the probe unit 10 can be mounted on each apparatus in high precision position alignment.

At the same time when the probe pins 22 are formed, positioning members 16 made of the same material as the probe pins 22 may be formed on the outer circumferential surface of the positioning holes 111. This positioning members 16 further improve the positioning precision. A protective film 32 shown in FIGS. 9A and 9B will be later described.

(Eighth Structure)

Figure 10:
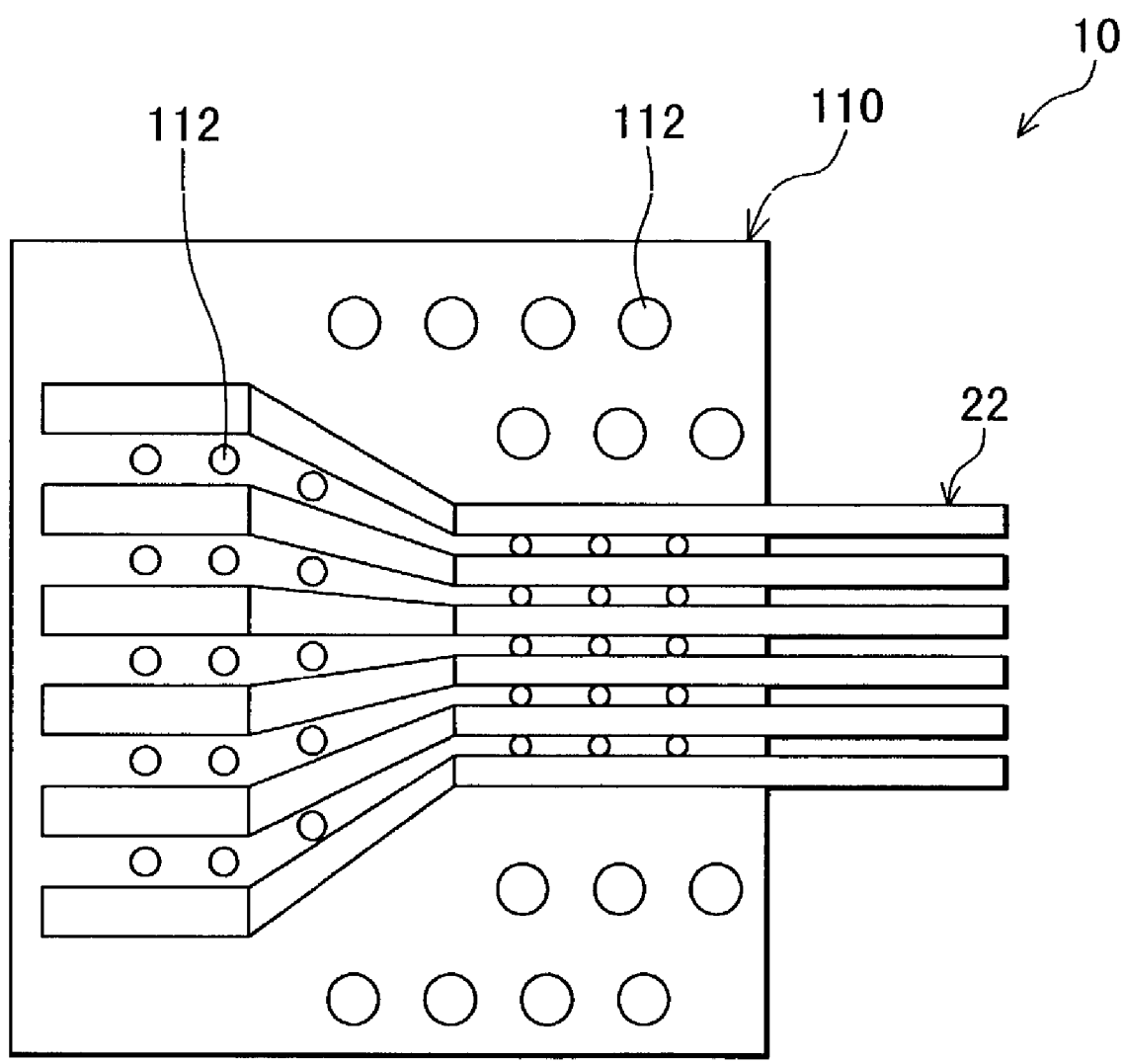
FIG. 10 is a plan view showing an eighth structure of a probe unit.

FIG. 10 is a plan view showing the eighth structure of the probe unit 10.

In the probe unit of the eighth structure, one or a plurality of small holes 112 may be formed through the probe holder 110. As will be later described, in a method of manufacturing a probe unit of the eighth structure, a sacrificial film and a plated copper layer are dissolved with etchant to separate an integrated part of probe pins and probe holder from a substrate. The small holes 112 are used for making large the contact area between the sacrificial film and etchant. Although the positions, size and number of small holes 112 are not limited specifically, it is preferable to form the small holes 112 in such a manner that etchant uniformly contacts the whole surface of the sacrificial film under the probe holder 110. A dissolution time of the sacrificial film can be shortened considerably.

(Ninth Structure)

FIG. 11A is a plan view showing the ninth structure of the probe unit 10, and FIG. 11B is a cross sectional view showing the ninth structure of the probe unit 10.

This probe unit 10 has a probe holder 110 and comb-shaped probe pins 22 formed on the distal side of a number of leads 20 highly precisely juxtaposed at a narrow pitch. The probe pins 22 are stacked upon the probe holder 110 and integrated therewith. To this probe unit 10, a flexible printed wiring flat cable 3 is joined which has a number of electrodes 113 disposed parallel at a narrow pitch. The probe unit 10 and flexible printed wiring flat cable 3 are joined together with each pair of a lead 20 and an electrode 113 being electrically connected.

Positioning holes 111 may be formed through the probe holder 110 to mount the probe unit 10 on each apparatus in position alignment. The size, shape, position of the positioning hole 111 are determined depending upon each apparatus on which the probe unit 10 is mounted. As will be later described, the position of each positioning hole 111 is determined highly precisely by using photoresist so that the probe unit 10 can be mounted on each apparatus in high precision position alignment.

At the same time when the probe pins 22 are formed, positioning members 16 made of the same material as the probe pins 22 may be formed on the outer circumferential surface of the positioning holes 111.

A pattern for determining a mount position and the probe pins are formed at the same time. Therefore, the positioning holes can be formed highly precisely so that the position precision between the probe pins and a test body can be improved.

(Tenth Structure)

Figure 12:
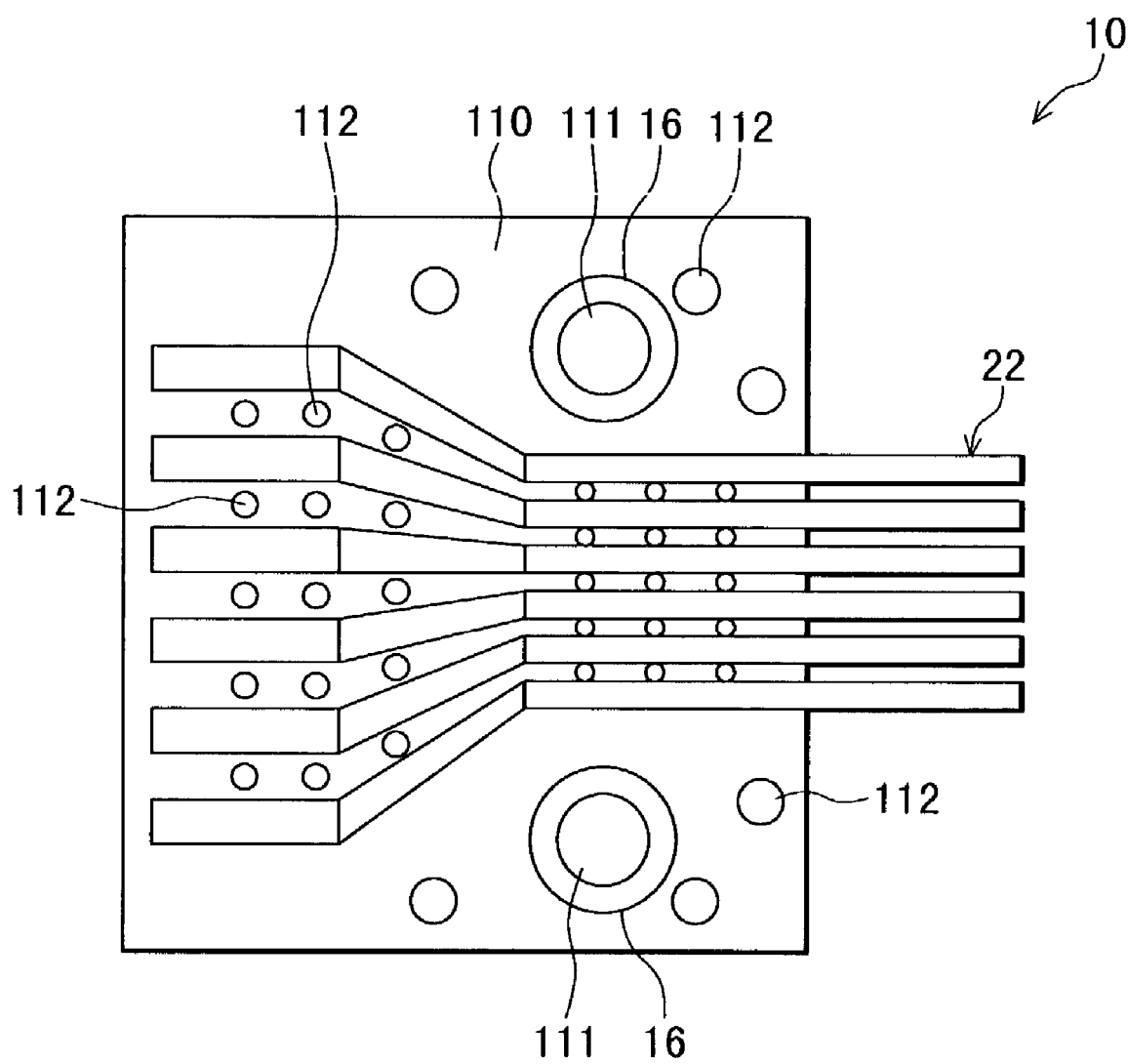
FIG. 12 is a plan view showing a tenth structure of a probe unit.

FIG. 12 is a plan view showing the tenth structure of the probe unit 10.

In the probe unit of the tenth structure, a plurality of small holes 112 may be formed through the probe holder 110. As will be later described, in a method of manufacturing a probe unit of the tenth structure, a sacrificial film is dissolved with etchant to separate an integrated part of probe pins and probe holder from a substrate. The small holes 112 are not limited specifically, it is preferable to contact area between the sacrificial film and etchant. Although the positions, size and number of small holes 112 are not limited specifically, it is preferable to form the small holes 112 in such a manner that etchant uniformly contacts the whole surface of the sacrificial film under the probe holder 110. A dissolution time of the sacrificial film can be shortened considerably.

(Eleventh Structure)

Figure 13A:
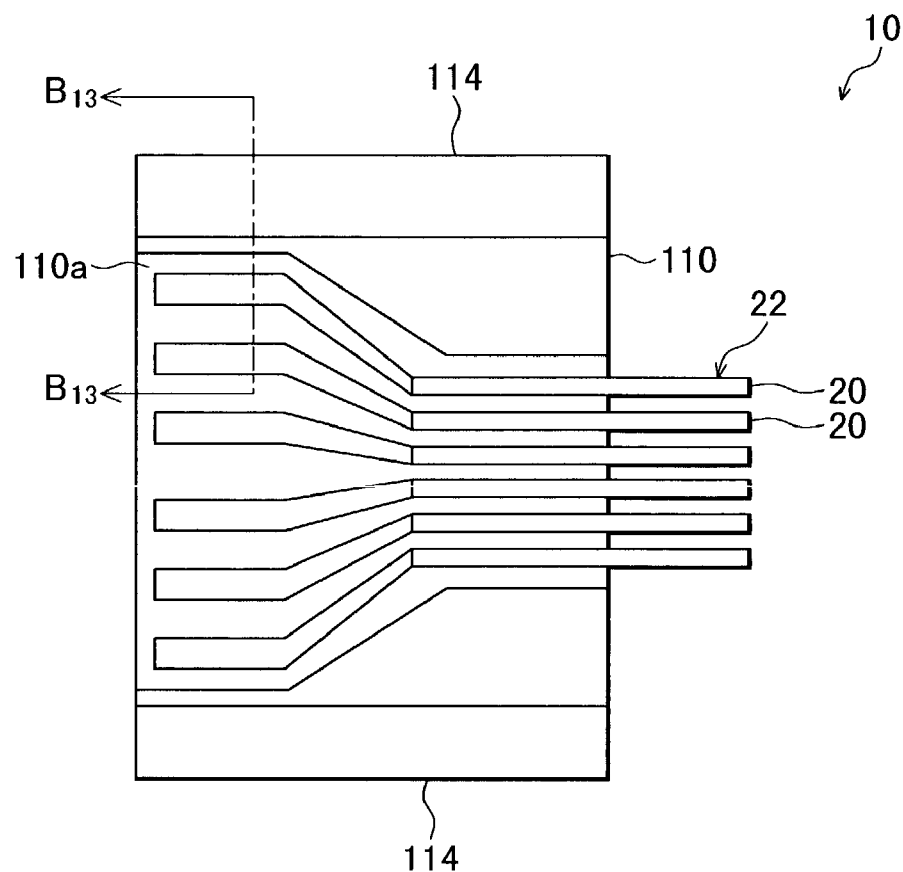
FIGS. 13A and 13B are a plan view and a cross sectional view showing an eleventh structure of a probe unit.
Figure 13B:
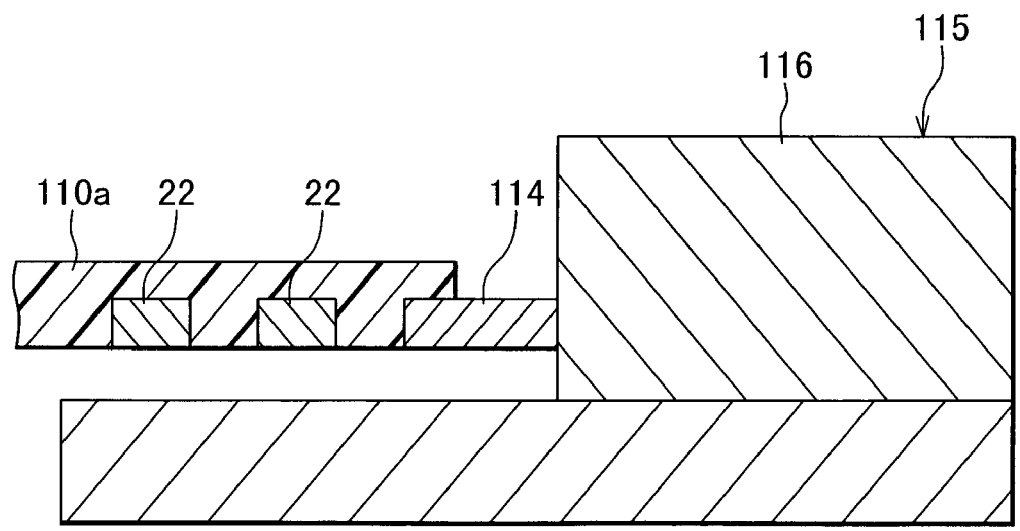

FIG. 13A is a plan view showing the eleventh structure of the probe unit 10, and FIG. 13B is a cross sectional view of the probe unit 10 taken along line $B_{13}$—$B_{13}$ shown in FIG. 13A.

The probe unit of the eleventh structure has a portion of the probe holder 110 made of a resin layer 110a.

In this probe unit, in order to electrically insulate the probe pins 22 from the probe holder 110, the portion of the probe holder 110 where the probe pins 22 are formed is made of the resin layer 110a of photosensitive polyimide or the like. Since the resin layer 110a has a large linear expansion coefficient and is deformed by a temperature change, the position precision of the probe pins is lowered. It is therefore preferable that the area occupied by the resin layer 110a of the probe holder 110 is small.

When this probe unit is mounted on each of conduction test apparatuses, the positioning frames 114 are fitted into a mount member 116 of a holder 115 of the conduction test apparatus.

(Twelfth Structure)

Figure 14A:
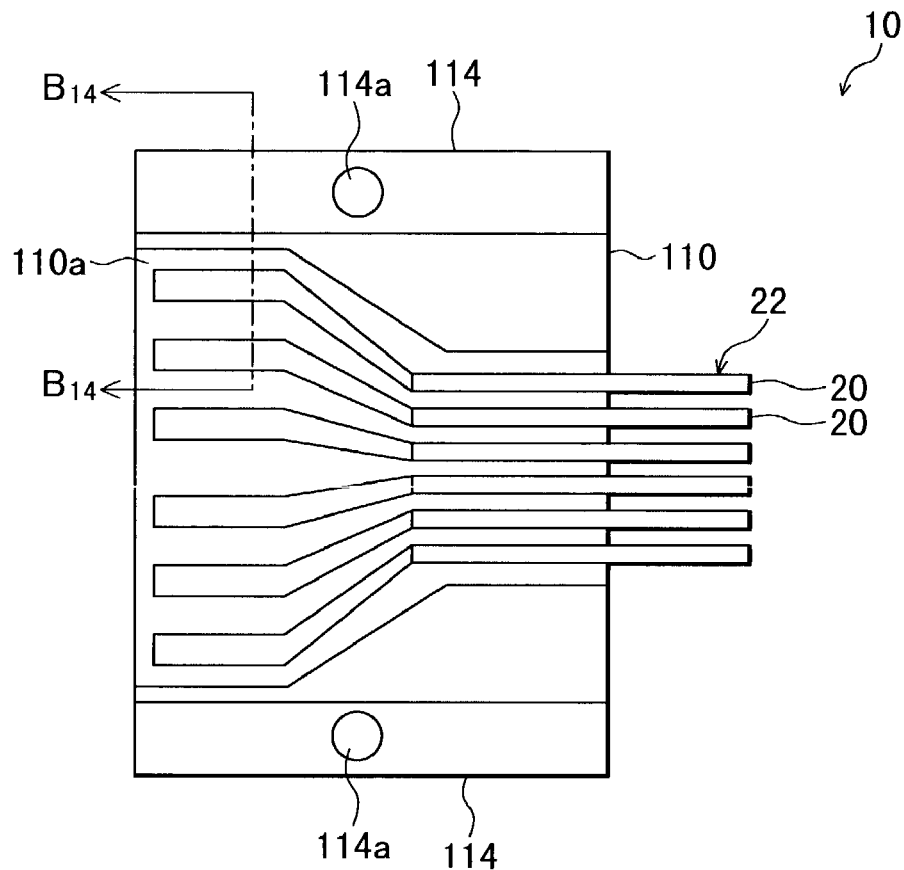
FIGS. 14A and 14B are a plan view and a cross sectional view showing a twelfth structure of a probe unit.
Figure 14B:
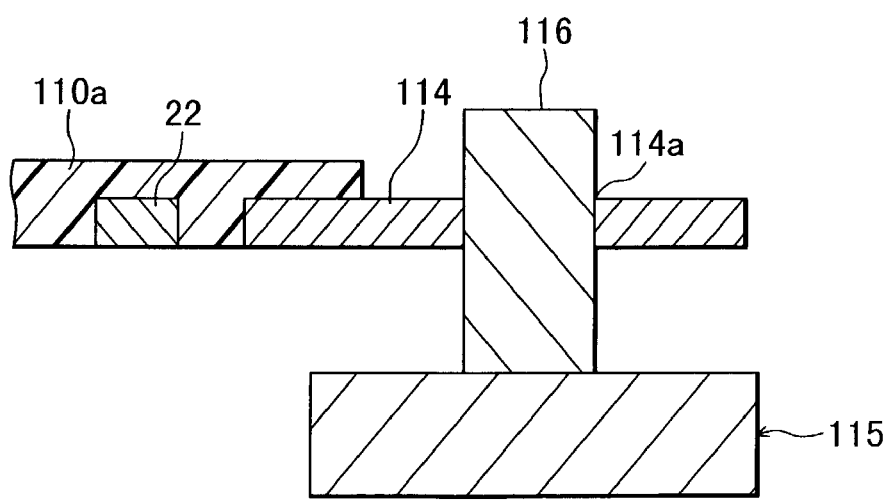

FIG. 14A is a plan view showing the twelfth structure of the probe unit 10, and FIG. 14B is a cross sectional view of the probe unit 10 taken along line $B_{14}$—$B_{14}$ shown in FIG. 14A.

The probe unit of the twelfth structure has positioning holes 114a formed through the positioning frames 114.

As will be later described, the positioning frames 114 and positioning holes 114a are formed at the same time. The precision of the positions of the positioning frames 114 and positioning holes 114a is therefore high. The position precision between the probe pins 22 and a test body can be improved.

When this probe unit is mounted on each of conduction test apparatuses, positioning pins 116 of the holder 115 of the conduction test apparatus are fitted into the positioning holes 114a.

Since the area occupied by the resin layer 110a of the probe holder 110 of this probe unit is small, it is possible to prevent the position precision of the probe pins from being lowered by a temperature change. Since resin is not used in the area near the positioning holes 114a, it is possible to prevent the position precision of the probe pins from being lowered by a temperature change.

(Thirteenth Structure)

Figure 15A:
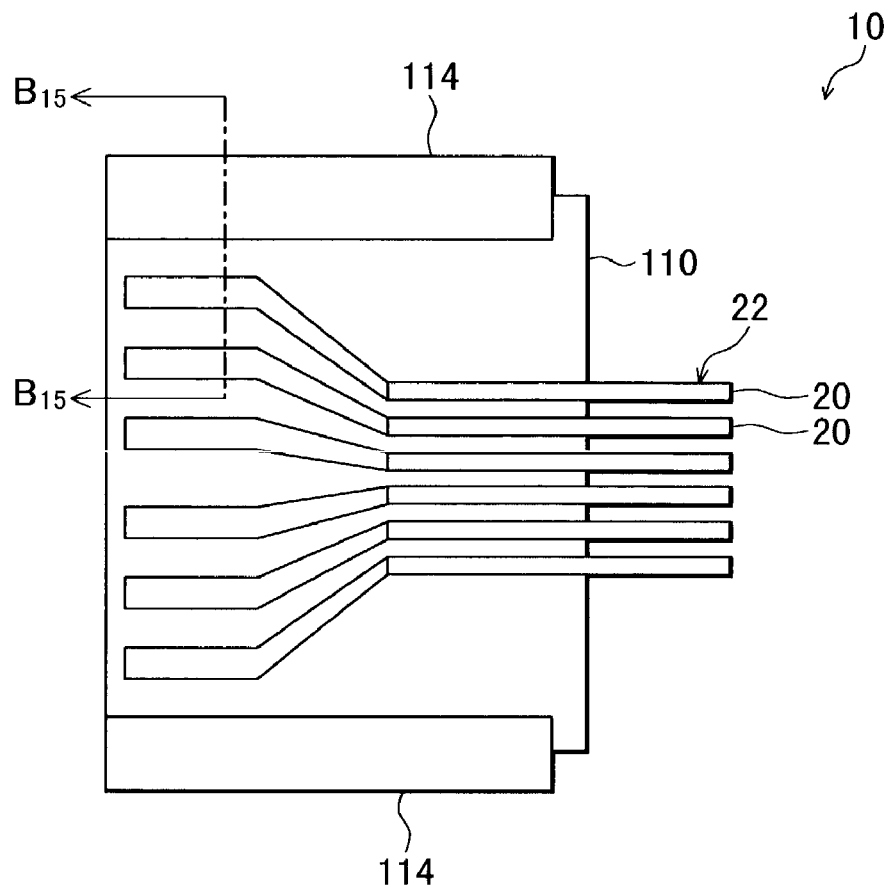
FIGS. 15A and 15B are a plan view and a cross sectional view showing a thirteenth structure of a probe unit.
Figure 15B:
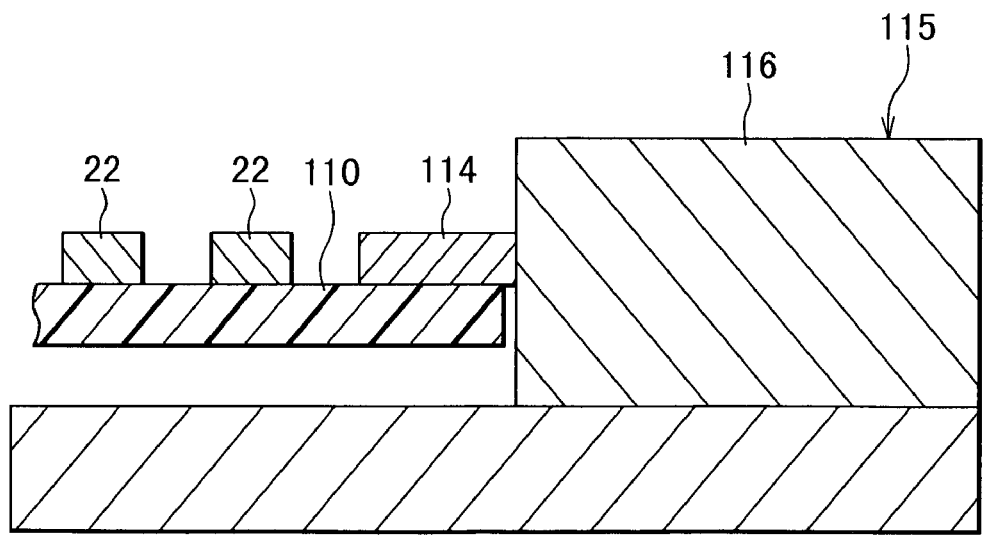

FIG. 15A is a plan view showing the thirteenth structure of the probe unit 10, and FIG. 15B is a cross sectional view of the probe unit 10 taken along line $B_{15}$—$B_{15}$ line shown in FIG. 15A. This probe unit of the thirteenth structure has a probe holder 110, comb-shaped probe pins 22 formed on the distal side of a number of leads 20 highly precisely juxtaposed at a narrow pitch, and positioning frames 114. The probe pins 22 and positioning frames 114 are stacked upon the probe holder 110 and integrated therewith.

The positioning frames 114 are disposed in parallel to the leads 20 on both sides of the probe holder 110. The positioning frame 114 is made of the same material as the probe pins. The size, shape, position of the positioning frame 114 are determined depending upon each conduction apparatus on which the probe unit 10 is mounted.

As will be later described, the positioning frames 114 for determining the mount position and the probe pins 22 are formed at the same time. The precision of the positions of the positioning frames 114 is therefore high. The position precision between the probe pins 22 and a test body can be improved.

When this probe unit is mounted on each conduction test apparatus, the positioning frames 114 are fitted in the mount member 116 of the holder of the conduction apparatus.

The structures of the probe unit 10 have been described above. Next, methods of manufacturing probe units 10 will be described. First to seventh manufacture methods will be described first. The first to seventh manufacture methods are applicable to any one of the first to fifth structures of the probe unit 10. The first to sixth methods will be described by taking as an example manufacturing the probe unit having the first structure. The seventh method will be described by taking as an example manufacturing the probe unit having the fifth structure.

(First Manufacture Method)

FIGS. 16A to 16H are schematic cross sectional views illustrating the first method of manufacturing the probe unit. By applying this manufacture method, the probe unit 10 having, for example, the first structure shown in FIG. 1 is manufactured.

Figure 16A:
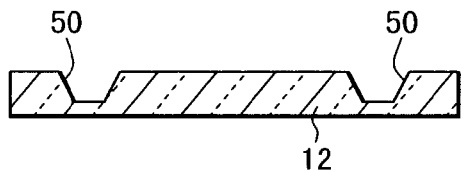
FIGS. 16A to 16H are schematic cross sectional views illustrating a first method of manufacturing a probe unit.

First, as shown in FIG. 16A, recesses 50 are formed in the surface layer of a substrate 12 made of insulating material such as glass ceramic, quartz and zirconia. The inner walls of the recesses 50 become the sides 12a, 12b and 12d of the substrate 12 after succeeding processes.

Figure 16E:
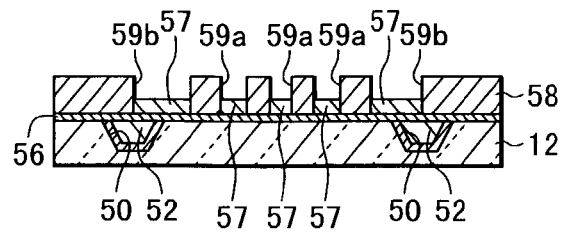
Figure 16B:
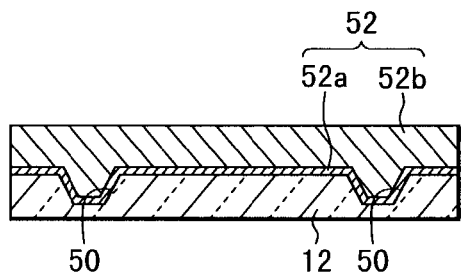

As shown in FIG. 16B, a sacrificial film 52 is formed on the surface of the substrate 12. Material of the sacrificial film 52 may be metal, synthetic resin such as epoxy resin and urethane resin, or inorganic salt such as calcium carbonate. If metal is to be used, metal different from the metal of the lead pattern 14, e.g., copper, is used. If copper is used, an underlying layer 52a is formed and then a copper film 52b is formed on the surface of the underlying layer 52a by plating, sputtering or the like. For example, the underlying layer 52a is a composite layer of a chrome layer of 30 nm in thickness and a copper layer of 300 nm in thickness. The copper film 52b is formed being filled in the recesses 50.

Figure 16F:
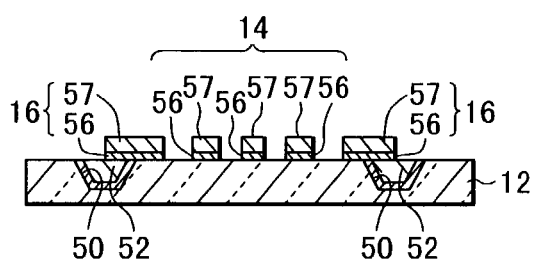
Figure 16C:
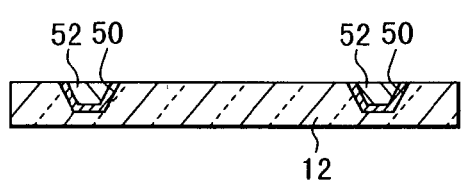

As shown in FIG. 16C, the sacrificial film 52 is polished to expose and planarize the surface of the substrate 12 and leave the sacrificial film 52 only in the recesses 50.

Figure 16G:
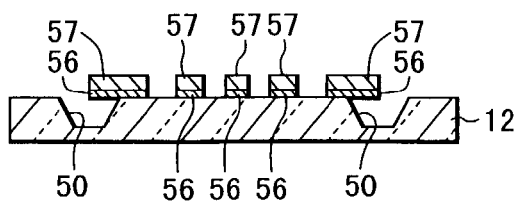
Figure 16D:
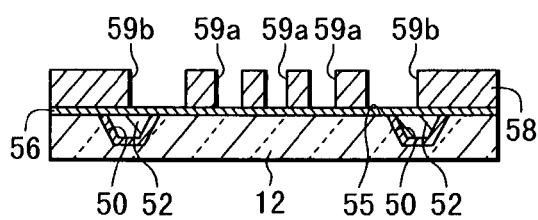

As shown in FIG. 16D, an underlying film 56 for the lead pattern 14 and positioning members 16 is formed on the polished surface 55, having a uniform thickness. On the surface of the underlying film 56, photoresist is coated. A mask having a predetermined pattern is disposed on the surface of the photoresist. Unnecessary photoresist is removed by a developing process to form a resist film 58. The resist film 58 has openings 59a for exposing the regions where the lead pattern 14 is formed and openings 59b for exposing the regions where the positioning members 16 are formed. Two of the openings 59b are formed above the recesses filled with the sacrificial film 52.

As shown in FIG. 16E, a cover film 57 is formed on the surface of the underlying film 56 exposed in the openings 59a and 59b by electroplating using known iron-nickel plating liquid which contains sulfuric acid as main composition. The cover film 57 is used as the lead pattern 14 and positioning members 16. The lead pattern 14 and positioning members 16 made of the same material are therefore formed on the bottoms of the openings 59a and 59b.

As shown in FIG. 16F, the resist film 58 is removed by washing the surface of the resist film 58 with ultrasonic waves using liquid such as N-methyl-2-pyrrolidone. Next, the underlying film 56 not covered with the cover film 57 is removed by a frame cut method such as ion milling or an etching method such as ion beam etching.

With the processes shown in FIGS. 16D to 16F, the lead pattern 14 and positioning members 16 made of the underlying film 56 and cover film 57 are formed at the same time by lithography. The probe pins 22 of the lead pattern 14 and the positioning members 16 can therefore be formed at a high precision of relative positions.

As shown in FIG. 16G, the sacrificial film 52 left in the recess 50 is removed. If the sacrificial film 52 is made of copper, the sacrificial film 52 is dissolved by using etchant which dissolves copper with a priority over other materials.

Figure 16H:
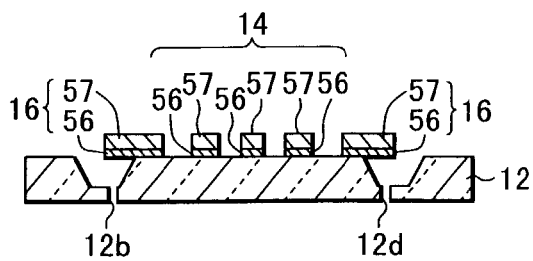

As shown in FIG. 16H, the substrate 12 is cut along a cut line reaching the bottom of the substrate. From the sides 12a, 12b and 12d of the substrate 12 along the cut line, the probe pins 22 of the lead pattern 14 (not shown in FIG. 16H) and the positioning members 16 protrude.

(Second Manufacture Method)

Figure 17A:
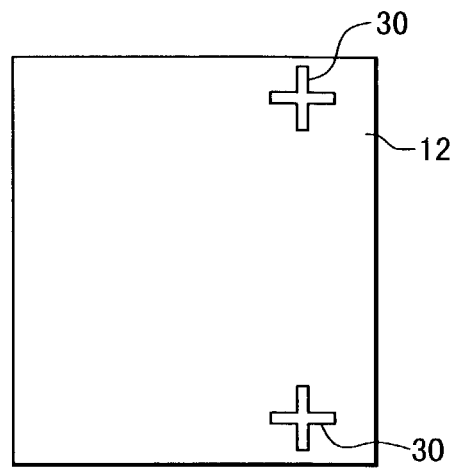
FIGS. 17A to 17C are schematic plan views illustrating a second method of manufacturing a probe unit.
Figure 17B:
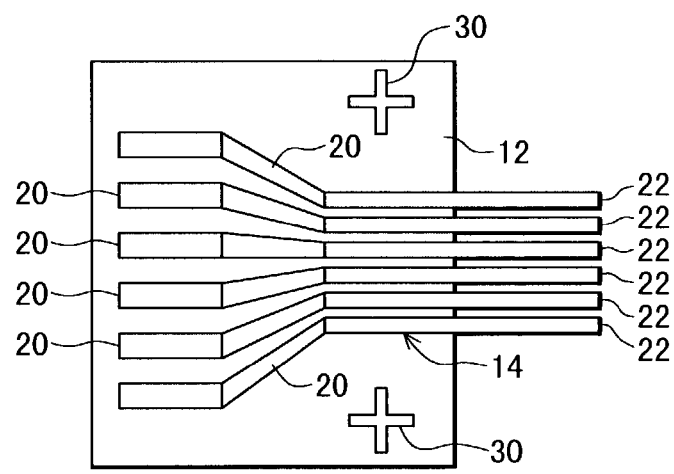
Figure 17C:
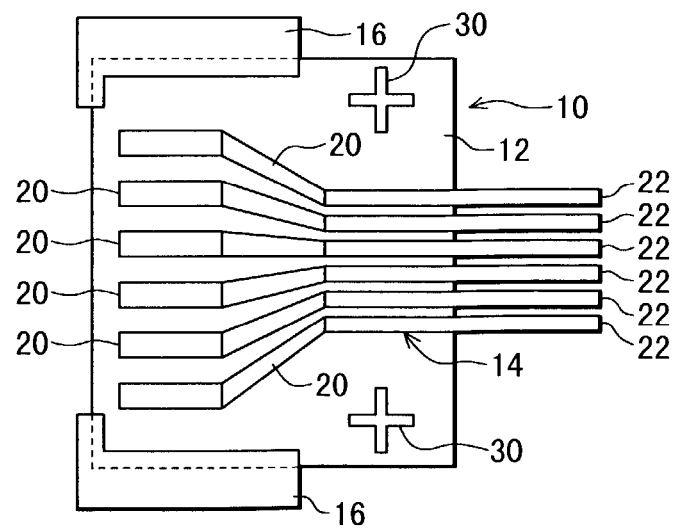

FIGS. 17A to 17C are schematic cross sectional views illustrating the second method of manufacturing the probe unit. By applying this manufacture method, the probe unit 10 having, for example, the first structure shown in FIG. 1 is manufactured.

As shown in FIG. 17A, alignment marks 30 are formed on the surface of the substrate 12 at predetermined positions. The alignment mark 30 may be formed either lithography, printing or mechanical working. The alignment mark has a shape such as a cross shown in FIG. 17A, a polygon or a circle whose centers can indicate specific positions correctly.

As shown in FIG. 17B, only the lead pattern 14 is formed on the surface of the substrate 12 by a method similar to the first manufacture method. In this case, in the process corresponding to FIG. 16D, openings 59a are formed through the resist film 58 at predetermined positions determined by using the alignment marks 30 as reference points. In the processes corresponding to FIGS. 16D to 16F, the probe pins 22 of the lead pattern 14 can therefore be formed by lithography at a high position precision relative to the alignment marks.

As shown in FIG. 17C, the positioning members 16 are formed on the surface of the substrate 12. In this case, in the process corresponding to FIG. 16D, the openings 59b are formed through the resist film 58 at predetermined positions determined by using the alignment marks as reference points. In the processes corresponding to FIGS. 16D to 16F, the positioning members 16 can therefore be formed by lithography at a high position precision relative to the alignment marks 30.

The probe pins 22 and positioning members 16 formed highly precisely at the positions determined by the common alignment marks 30 can therefore be formed at a high precision of relative positions. The process shown in FIG. 17B and the process shown in FIG. 17C may be reversed in order with similar expected effects.

(Third Manufacture Method)

Figure 18A:
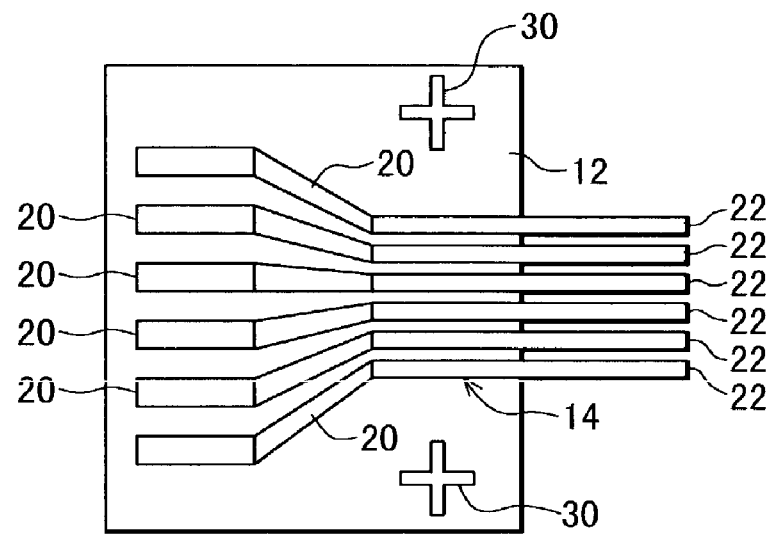
FIGS. 18A and 18B are schematic plan views illustrating a third method of manufacturing a probe unit.
Figure 18B:
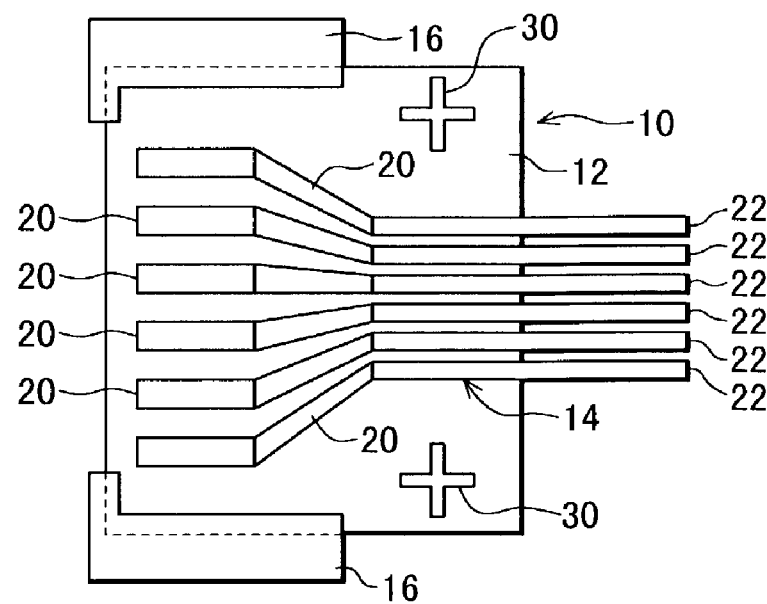

FIGS. 18A and 18B are schematic plan views illustrating the third method of manufacturing the probe unit. By applying this manufacture method, the probe unit 10 having, for example, the first structure shown in FIG. 1 is manufactured.

In the third manufacture method, part of the second manufacture method is modified. Namely, the process shown in FIG. 17A is omitted, and the process shown in FIG. 17B is replaced with the process shown in FIG. 18A. In the process shown in FIG. 18A, at the same time when the lead pattern 14 is formed by a method similar to the first manufacture method, the alignment marks 30 are formed. In the process corresponding to the process shown in FIG. 16D, the openings 59a for forming the lead pattern 14 as well as openings for exposing the regions where the alignment marks 30 are formed are formed through the resist film 58 without forming the openings 59b. With processes corresponding to those shown in FIGS. 16D to 16F, the lead pattern 14 and alignment marks 30 are formed at the same time by lithography.

After the process shown in FIG. 18A, in the process shown in FIG. 18B the positioning members 16 are formed by a process similar to the second manufacture method shown in FIG. 17C. Since the positioning members 16 are formed highly precisely at the positions determined by the alignment marks 30 formed at the same time when the lead pattern 14 was formed, they can be formed at a high precision of relative positions to the probe pins 22 of the lead pattern 14.

(Fourth Manufacture Method)

Figure 19A:
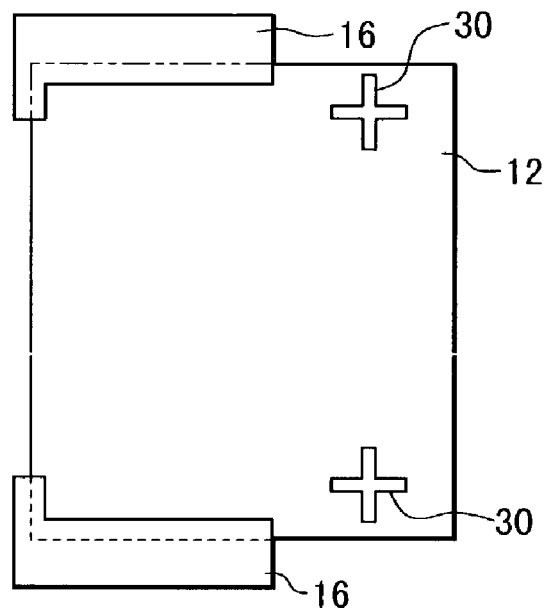
FIGS. 19A and 19B are schematic plan views illustrating a fourth method of manufacturing a probe unit.
Figure 19B:
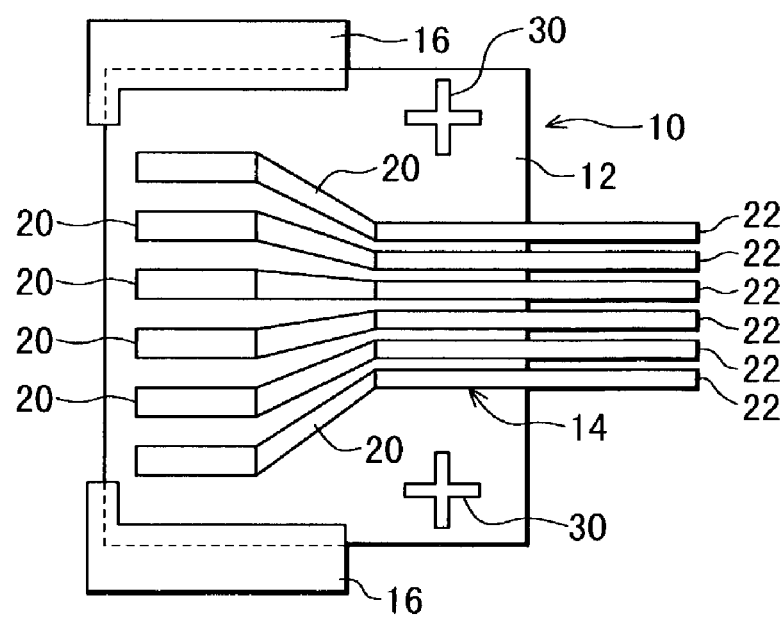

FIGS. 19A and 19B are schematic plan views illustrating the fourth method of manufacturing the probe unit. By applying this manufacture method, the probe unit 10 having, for example, the first structure shown in FIG. 1 is manufactured.

In the fourth manufacture method, part of the second manufacture method is modified. Namely, the process shown in FIG. 17A is omitted, and the process shown in FIG. 19A is performed before the process shown in FIG. 17B. In the process shown in FIG. 19A, at the same time when the positioning members 16 are formed by a method similar to the first manufacture method, the alignment marks 30 are formed. In the process corresponding to the process shown in FIG. 16D, the openings 59b for forming the positioning members 16 as well as openings for exposing the regions where the alignment marks 30 are formed are formed without forming the openings 59a. With processes corresponding to those shown in FIGS. 16D to 16F, the positioning members 16 and alignment marks 30 are formed at the same time by lithography.

After the process shown in FIG. 19A, in the process shown in FIG. 19B the lead pattern 14 is formed by a process similar to the second manufacture method shown in FIG. 17C. Since the probe pins 22 of the lead pattern 14 are formed highly precisely at the positions determined by the alignment marks 30 formed at the same time when the positioning members 16 were formed, they can be formed at a high precision of relative positions to the positioning members 16.

In the second to fourth manufacture methods, the materials, film thicknesses (heights) of the alignment marks 30, probe pins 22 of the lead pattern 14 and the positioning members 16 may be set differently. In this case, for example, the mechanical strength of only the positioning members 16 may be made high or the alignment marks 30 may be made thin. To this end, the material and deposition conditions of the underlying film 56 and cover film 57 constituting the alignment marks 30, lead pattern 14 and positioning members 16 are set differently. If the mechanical strength of only the positioning members 16 is to be made high, by masking the alignment marks 30 and lead pattern 14, electroplating is further performed to deposit the plated film on the surface of the positioning members 16.

(Fifth Manufacture Method)

FIGS. 20A to 20J are schematic cross sectional views illustrating the fifth method of manufacturing the probe unit. By applying this manufacture method, the probe unit 10 having, for example, the first structure shown in FIG. 1 is manufactured.

Figure 20A:
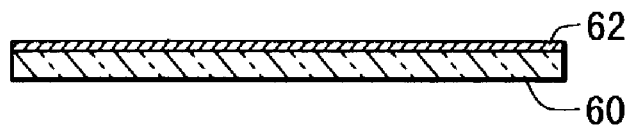
FIGS. 20A to 20J are schematic cross sectional views illustrating a fifth method of manufacturing a probe unit.

As shown in FIG. 20A, a first sacrificial film 62 is formed on the surface of a base plate 60. Material of the base plate 60 may be glass, ceramic, silicone, metal or the like. For example, the first sacrificial film 62 is a composite film of a chrome film of 0.03 μm in thickness and a copper film of 0.3 μm in thickness formed by sputtering.

Figure 20B:
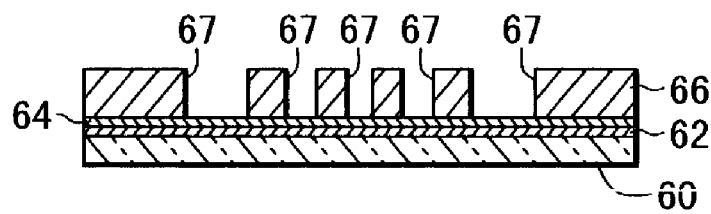

As shown in FIG. 20B, a first underlying film 64 is formed on the first sacrificial film 62, having a uniform thickness. The first underlying film 64 becomes the lead pattern 14 and positioning members 16 after succeeding processed. For example, the first underlying film 64 is a composite film of a titanium film of 0.02 μm in thickness and an iron-nickel alloy film of 0.15 μm. Next, a resist film 66 is formed on the first underlying film 64. Openings 67 are formed through the resist film 66, exposing the regions where the lead pattern 14 and positioning members 16 are formed.

Figure 20C:
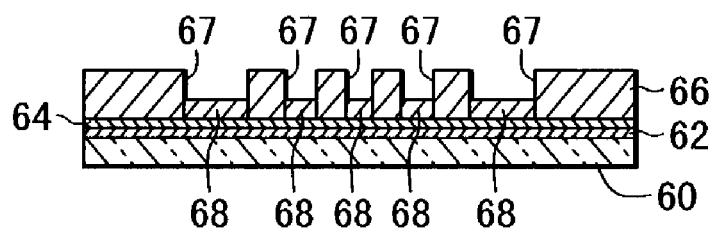

As shown in FIG. 20C, a cover film 68 is formed on the surface of the first underlying film 64 exposed in the openings 67. The cover film 68 becomes the lead pattern 14 and positioning members 16 after succeeding processes. For example, the cover film 68 is formed by electroplating nickel alloy using known iron-nickel plating liquid which contains sulfuric acid as main composition. The lead pattern 14 and positioning members 16 are therefore made of the same material and have the same thickness.

Figure 20D:
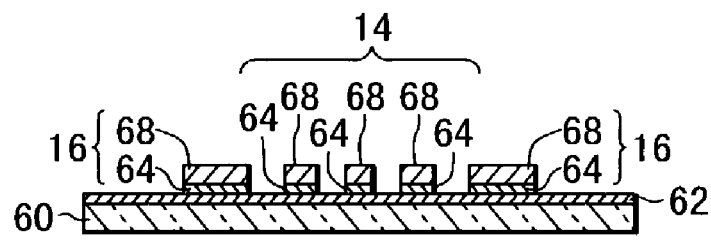

As shown in FIG. 20D, the resist mask 66 is removed by using, for example, organic solvent. Next, the first underlying film 64 not covered with the cover film 68 is removed by ion milling or the like.

With the processes shown in FIGS. 20B to 20D, the lead pattern 14 and positioning members 16 constituted of the first underlying film 64 and cover film 68 are formed at the same time by lithography, and the probe pins 22 of the lead pattern 14 and the positioning members 16 are formed at a high precision of relative positions. Instead of electroplating using resist, the cover film 68 may be formed by etching a conductive film formed by plating, or by printing conductive paste. By utilizing lithography, a high size precision of the lead pattern 14 and positioning members 16 can be obtained.

Figure 20E:
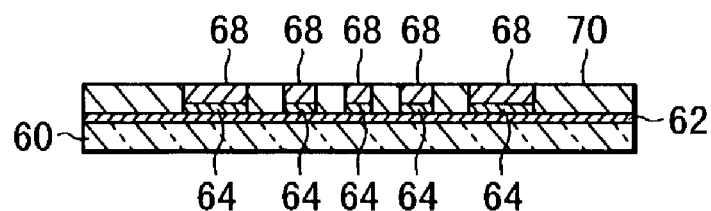

As shown in FIG. 20E, a second sacrificial film 70 is formed on the surface of the first sacrificial film 62 and cover film 68. For example, the second sacrificial film 70 is formed by plating copper or the like on the surface of the first sacrificial film 62 and overflowing the plated copper on the surface of the cover film 68. Next, the surface of the second sacrificial film 70 is polished and planarized to expose the surface of the cover film 68.

Figure 20F:
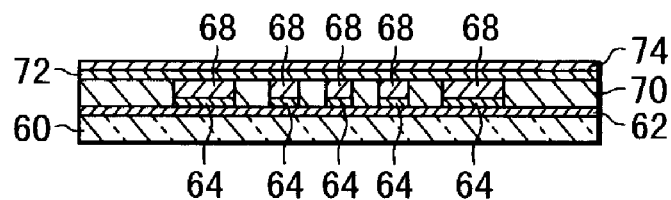

As shown in FIG. 20F, an insulating film 72 is formed on the surface of the second sacrificial film 70 and cover film 68. The insulating film 72 together with a second underlying film 74 and a support film 78 to be later described constitutes a substrate 12. Material of the insulating film may be silicon dioxide, alumina or the like. Next, similar to the first underlying film 64, a second underlying film 74 is formed on the insulating film 72.

Figure 20G:
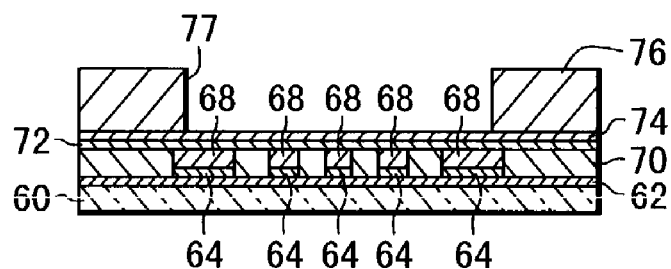

As shown in FIG. 20G, photoresist is coated on the surface of the second underlying film 74. A mask having a predetermined pattern is disposed on the surface of the photoresist. Unnecessary photoresist is removed by a developing process to form a resist film 76. The resist film 76 has an opening 77 for exposing the region where the substrate 12 is formed. The opening 77 has a shape corresponding to the lead pattern 14 and positioning members 16 constituted of the first underlying film 64 and cover film 68.

Figure 20H:
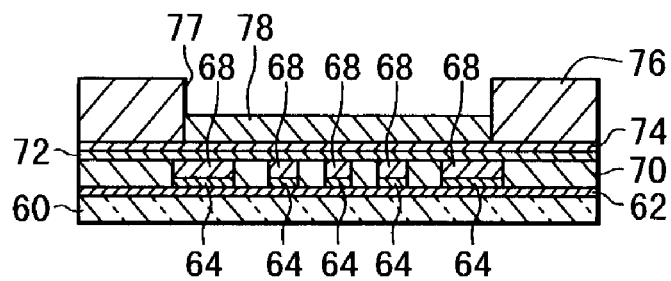

As shown in FIG. 20H, a support film 78 is formed on the surface of the second underlying film 74 exposed on the bottom of the opening 77. For example, the support film 78 is formed by plating metal on the bottom of the opening 77.

Figure 20I:
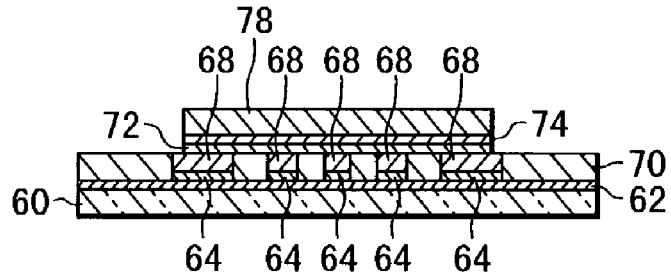

As shown in FIG. 20I, similar to the resist film 66 and first underlying film 64, the resist film 76 and the second underlying film 74 not covered with the support film 78 are removed. Next, the insulating film 72 not covered with the second underlying film 74 is removed, for example, by ion etching.

Figure 20J:
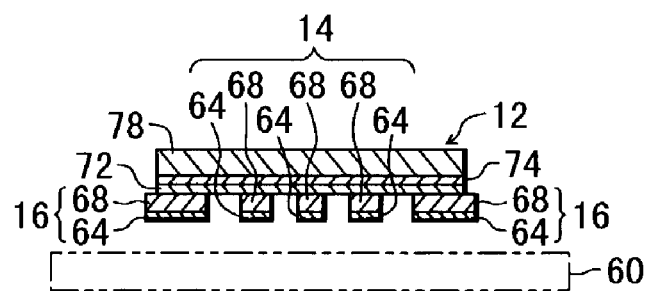

As shown in FIG. 20J, the first and second sacrificial films 62 and 70 are removed. The substrate 12 with the integrated lead pattern 14 and positioning members 16 is therefore formed. As the first sacrificial film 62 is removed, the base plate 60 is separated from the lead pattern 14 and positioning members 16. If the sacrificial films 62 and 70 are made of copper, the sacrificial films 62 and 70 are dissolved by using etchant which dissolves copper with a priority over other materials. Prior to removing the sacrificial films 62 and 70 by etching, holes are formed through the support film 78, second underlying film 74 and insulating film 72 so that the sacrificial films 62 and 70 can be separated at higher speed.

(Sixth Manufacture Method)

FIGS. 21A to 21F are schematic cross sectional views illustrating the sixth method of manufacturing the probe unit. By applying this manufacture method, the probe unit 10 having, for example, the first structure shown in FIG. 1 is manufactured.

Figure 21A:
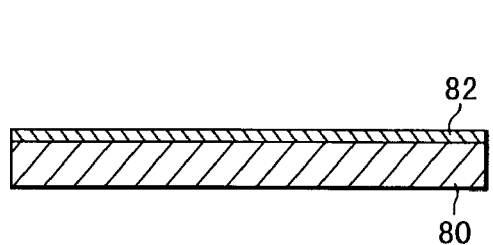
FIGS. 21A to 21F are schematic cross sectional views illustrating a sixth method of manufacturing a probe unit.

As shown in FIG. 21A, a sacrificial film 82 is formed on the surface of a base plate 80. Material of the base plate 80 may be stainless steel. The sacrificial film 82 is formed by plating metal or sputtering.

Figure 21B:
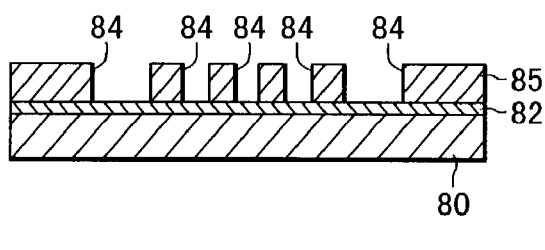
Figure 21C:
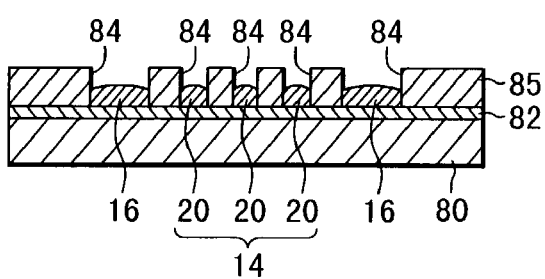
Figure 21D:
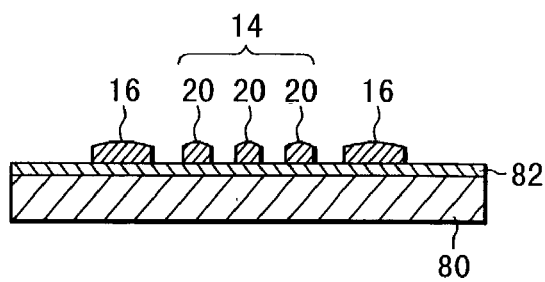

As shown in FIGS. 21B to 21D, the lead pattern 14 and positioning members 16 are formed by a method similar to the processes of the fifth manufacture method shown in FIGS. 20B to 20D. Namely, as shown in FIG. 21B, a resist film 85 is formed which has openings 84 exposing the regions where the lead pattern 14 and positioning members 16 are formed. Next, as shown in FIG. 21C, the leads 20 of the lead pattern 14 and the positioning members 16 are formed on the surface of the sacrificial film 82 exposed on the bottom of the openings 84. Thereafter as shown in FIG. 21D, the resist film 85 is removed. Since the lead pattern 14 and positioning members 16 are formed at the same time by lithography, the probe pins 22 of the lead pattern 14 and the positioning members 16 can be formed at a high precision of relative positions.

Figure 21E:
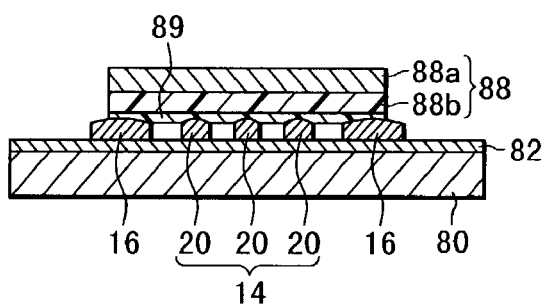

As shown in FIG. 21E, a film 88 is attached to the surface of the lead pattern 14 and positioning members 16 with adhesive 89. This film 88 is used as a substrate 12. For example, as shown in FIG. 21E the film 88 is a composite film of a metal layer 88a and a synthetic resin layer 88b which can increase the mechanical strength of the film 88 relative to expansion and contraction. Material of the metal layer 88a of the composite film is nickel alloy, copper or the like, and material of the synthetic resin layer 88b is polyimide or the like.

Figure 21F:
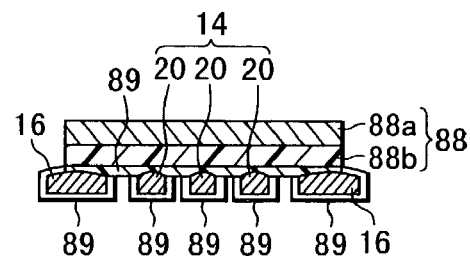

As shown in FIG. 21F, the sacrificial film 82 is separated from the base plate 80. Then, the sacrificial film 82 is removed by etching or the like. Thereafter, if necessary, the outer surfaces of the leads 20 of the lead pattern 14 are covered with plated gold 89. As shown in FIG. 21F the plated gold 89 may be formed on the outer surfaces of the positioning members 16 or may not be formed in order to increase the position alignment precision of abutment between the positioning members 16 and fixing jig 14.

(Seventh Manufacture Method)

FIGS. 22A to 22H are schematic cross sectional views illustrating the seventh method of manufacturing the probe unit. By applying this manufacture method, the probe unit 10 having, for example, the fifth structure shown in FIGS. 5A and 5B is manufactured.

Figure 22A:
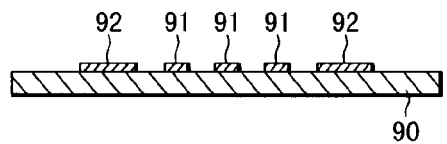
FIGS. 22A to 22H are schematic cross sectional views illustrating a seventh method of manufacturing a probe unit.

As shown in FIG. 22A, on the surface of a base plate 90 made of single silicon crystal, metal deposition films 91 and 92 are formed by lithography. The metal deposition films 91 have a pattern corresponding to the layout of the probe pins 22, and the metal deposition films 92 have a pattern corresponding to the layout of the positioning members 16. Material of the metal deposition films 91 and 92 may be gold.

Figure 22B:
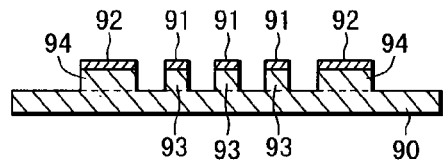

As shown in FIG. 22B, the base plate 90 covered with the metal deposition films 91 and 92 are grown, for example, by about 1 to 500 µm by a VLS (Vapor-Liquid-Solid) growth method.

Figure 22C:
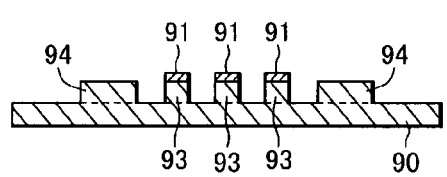

As shown in FIG. 22C, only the metal deposition films 92 covering the grown regions 94 which constitute the positioning members 16 are removed. For example, the metal deposition films 92 can be selectively removed by covering the metal deposition films 91 with a resist film, performing ion milling or etching, and then removing the resist film.

Figure 22D:
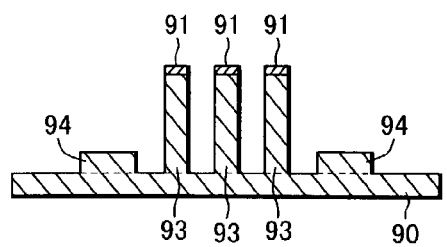

As shown in FIG. 22D, only the grown regions 93 covered with the metal deposition films 91 are further grown by the VLS method. The grown regions 93 which constitute the probe pins 22 are grown in a rod shape to a length of about 200 to 5000 µm, depending upon the length of the probe pins 22.

Figure 22E:
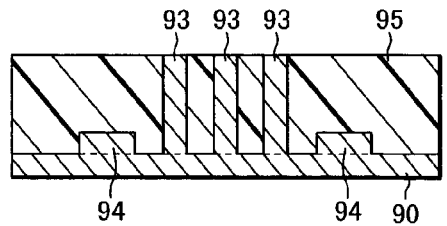

As shown in FIG. 22E, synthetic resin 95 is deposited covering the grown regions 93 and hardened. The upper surfaces of the grown regions 93 are polished to make them flush. In this case, the metal deposition films 91 covering the upper surfaces of the grown regions 93 may be removed as shown in FIG. 22E or part of the metal deposition films 91 may be left.

Figure 22F:
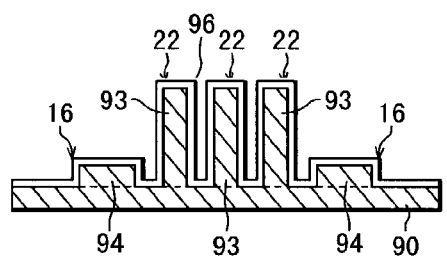

As shown in FIG. 22F, after the synthetic resin 95 is removed, the surfaces of the base plate 90 and grown regions 93 and 94 are covered with a conductive film 96. For example, the conductive film 96 is formed by plating metal such as gold and rhodium. In order to retain electrical insulation between the probe pins 22, the grown regions 93 excepting the top surfaces may be coated with synthetic resin such as polyimide.

With the processes shown in FIGS. 22A to 22F, the probe pins 22 of the lead pattern 14 constituted of the grown regions 93 and conductive films 96 and the positioning members 16 constituted of the grown regions 94 and conductive films 96 are formed at the same time by lithography. The probe pins 22 and positioning members 16 can therefore be formed at a high precision of relative positions.

Figure 22G:
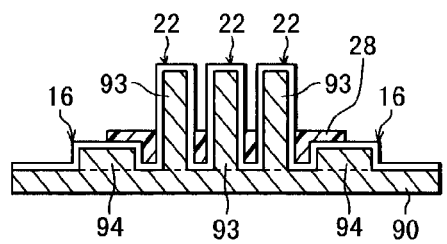

As shown in FIG. 22G, the base portions of the probe pins 22 and the partial surfaces of the positioning members 16 are covered with synthetic resin to form a reinforcing film 28.

Figure 22H:
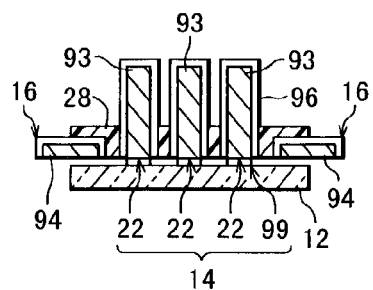

As shown in FIG. 22H, the probe pins 22, positioning members 16 and reinforcing film 28 are separated from the base plate 90. Next, this separated structure is adhered to a substrate 12 formed with a pattern 99 of the lead pattern 14 excepting the probe pins 22. The lead pattern 14 is completed by correctly adhering the probe pins 22 and pattern 99.

In the seventh manufacture method, the metal deposition films 91 covering the grown regions 93 constituting the probe pins 22 may be selectively removed by leaving the metal deposition film 92 covering the grown regions 94 constituting the positioning members 16. By setting the height (thickness) of the positioning members 16 higher than that of the probe pins 22, the mechanical strength of the positioning members 16 can be increased.

(Eighth Manufacture Method)

FIGS. 23A to 23F are schematic cross sectional views illustrating the eighth method of manufacturing the probe unit. By applying this manufacture method, the probe unit 10 having, for example, the sixth structure shown in FIGS. 8A to 8C can be manufactured.

Figure 23A:
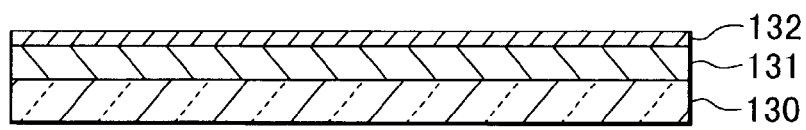
FIGS. 23A to 23F are schematic cross sectional views illustrating an eighth method of manufacturing a probe unit.

In this method of manufacturing the probe unit, first as shown in FIG. 23A, on the surface of a substrate 130 a sacrificial film 131 is formed by sputtering, vacuum deposition, ion plating or the like, preferably by sputtering. On the surface of the sacrificial film 131, an underlying film 132 for the probe unit is formed.

Although not specifically limited, material of the substrate 130 is a glass plate, a synthetic resin plate, a ceramic plate, a silicon plate, a metal plate or the like having a thickness of several mm.

Material of the sacrificial film 131 is preferably a copper thin film, a copper (Cu)/chrome (Cr) thin film or the like having a thickness of 0.1 to 5.0 µm.

If the copper/chrome thin film is to be used as the sacrificial film 131, first chrome is sputtered to form a tight contact layer, and copper is sputtered on this tight contact layer. In this case, for example, a thickness of the chrome thin film is 0.03 µm and a thickness of the copper thin film is about 0.3 µm.

The underlying film 132 is preferably a titanium (Ti)/nickel (Ni)-iron (Fe) thin film or the like having a thickness of about 0.05 to 0.5 µm. If the titanium/nickel-iron thin film is to be formed as the underlying film 132, first a titanium thin film is formed as a tight contact layer by sputtering, and a nickel iron thin film is formed on the titanium thin film by sputtering. In this case, for example, a thickness of the titanium thin film is 0.02 µm and a thickness of the nickel-iron thin film is about 0.15 µm.

The underlying film 132 is used because if a resist film of photoresist to be later described is formed directly on the sacrificial film 131, a resist film having a high resolution cannot be obtained. Depending upon the kind of photoresist, the underlying film 132 may be omitted. Since the underlying film 132 has good wettability with photoresist to be described later, a resist film having a high resolution and a desired shape can be formed on the sacrificial film 131.

Figure 23B:
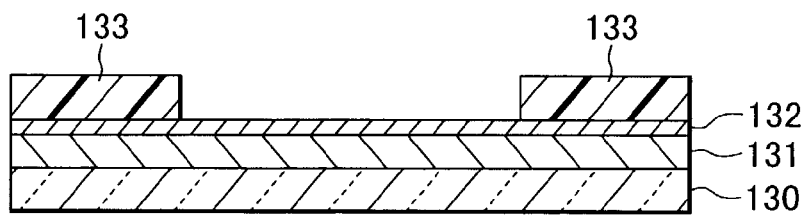

As shown in FIG. 23B, on the surface of the underlying film 132, photoresist is coated to an arbitrary thickness. A mask having a predetermined pattern is disposed on the surface of the photoresist. Exposure and development processes are performed to remove unnecessary photoresist to form a resist film 133 having openings corresponding to a predetermined probe unit pattern. A thickness of the resist film 133 is preferably in the range from 10 to 200 $\mu$m.

Figure 8B:
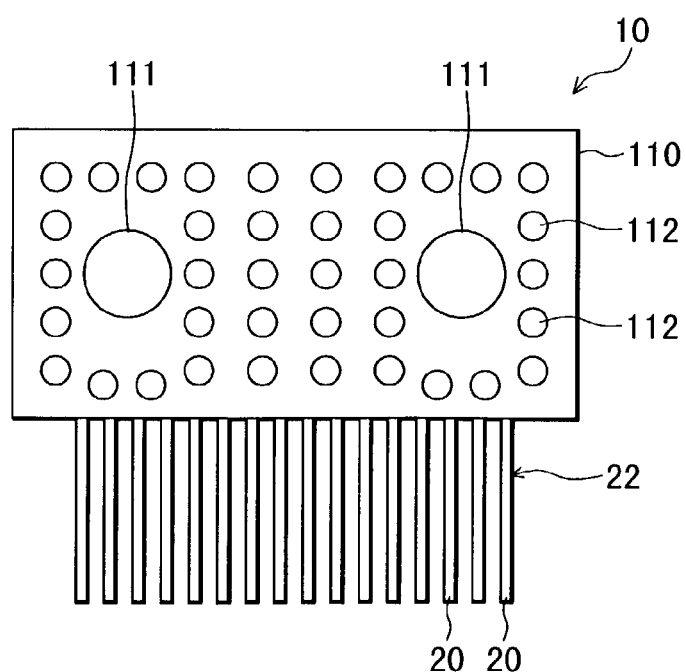
Figure 8C:
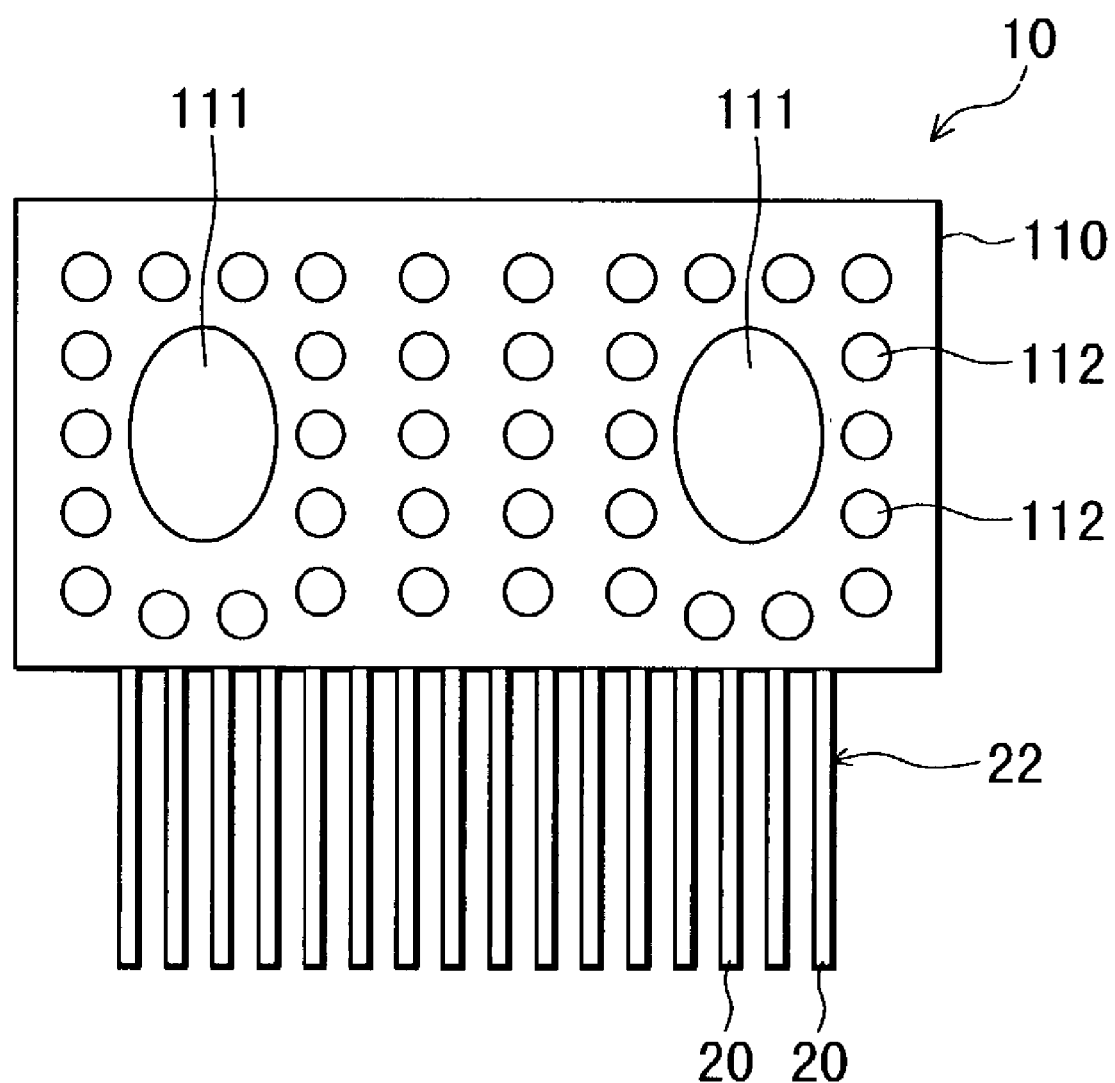

This probe unit pattern of the openings of the resist film 133 includes the pattern for forming the probe pins and probe holder constituting the probe unit as well as the pattern for forming the positioning member such as one or a plurality of positioning holes and positioning frames and the pattern for forming small holes, as described with reference to FIGS. 8A to 8C.

Since the resist film 133 of photoresist is used, patterns of the leads constituting the probe pins can be formed in parallel at a narrow pitch, e.g., a narrow and uniform pitch. The probe pins formed by using this resist film 133 can therefore be formed in parallel at a narrow pitch. Similarly, the probe pins and probe holder of the probe unit formed by using the resist film 133 can be formed at a high precision of relative positions. The positioning holes and small holes can also be formed at a high precision of position alignment.

Figure 23C:
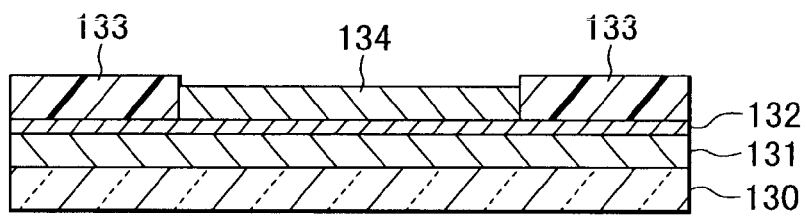

As shown in FIG. 23C, a nickel alloy metal foil 134 is formed on the surfaces of the underlying film 132 not covered with the resist film 133, by electroplating using known iron-nickel plating liquid which contains sulfuric acid as main composition. A thickness of the metal foil 134 is set as desired.

Figure 23D:
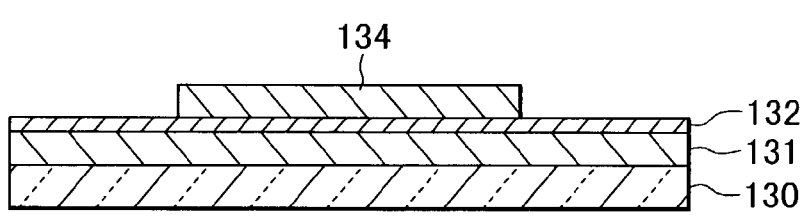

As shown in FIG. 23D, the resist film 133 is removed by washing the interface between the resist film 133 and underlying film 132 with ultrasonic waves using liquid such as N-methyl-2-pyrrolidone. In this case, by immersing the structural body of the substrate 130, resist film 133 and the like in N-methyl-2-pyrrolidone and performing ultrasonic washing at 85° C., the resist film 133 can be efficiently removed.

Figure 23E:
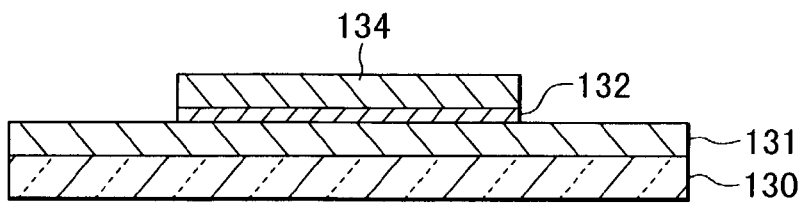

As shown in FIG. 23E, the exposed underlying film 132 is removed by ion milling so that the underlying film 132 and metal foil 134 have the same outer size.

Figure 23F:
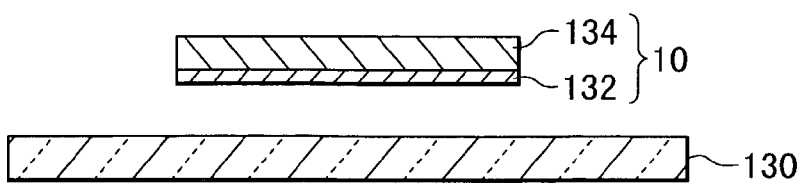

As shown in FIG. 23F, an integrated part of the metal foil 134 and underlying film 132 can be separated from the substrate 130. A probe unit 10 with the metal foil and underlying film 132 can be obtained. With the method of manufacturing the probe unit having the sixth structure, the probe pins and probe holder are formed integrally without joining the probe pins and probe holder mechanically or with solder or adhesive. It is therefore possible to prevent the probe pins from being damaged. It is also possible to form the probe pins and probe holder at a high precision of relative positions.

Since it is not necessary to physically cut the probe holder, the outer size can be determined highly precisely and the probe pins are prevented from being broken during a cutting process.

(Ninth Manufacture Method)

Figure 24A:
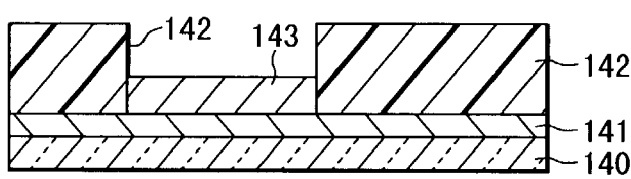
FIGS. 24AX and 24AY to FIGS. 24LX and 24LY are schematic cross sectional views illustrating a ninth method of manufacturing a probe unit.
Figure 24A:
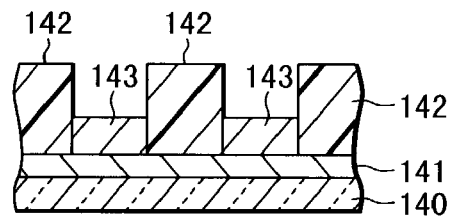

FIGS. 24AY to 24LY are shematic cross sectional views illustrating the ninth method of manufacturing the probe unit. By applying this manufacture method, the probe unit 10 having, for example, the seventh structure shown in FIGS. 9A and 9B or the eighth structure shown in FIG. 10 can be manufactured.

FIGS. 24AX, 24BX, . . . , 24LX are cross sectional views taken along a direction parallel to the longitudinal direction of the probe unit, and FIGS. 24AY, 24BY, . . . , 24LY are cross sectional views illustrating processes of forming positioning holes in the probe holder of the probe unit.

In the ninth method of manufacturing the probe unit, first as shown in FIG. 24AX and 24BY, on the surface of a substrate 140 a sacrificial film 141 is formed by sputtering, vacuum deposition, ion plating or the like, preferably by sputtering. On the surface of the sacrificial film 141, photoresist is coated to an arbitrary thickness. A mask having a predetermined pattern is disposed on the surface of the photoresist. Exposure and development processes are performed to remove unnecessary photoresist to form a first resist film 142 having an opening corresponding to the pattern of the probe holder of the probe unit. A thickness of the first resist film 142 is preferably in the range from 10 to 200 $\mu$m. Next, a first nickel alloy metal foil 143 is formed on the surfaces of the sacrificial film 141 not covered with the first resist film 142, by electroplating using known iron-nickel plating liquid which contains sulfuric acid as main composition. A thickness of the first metal foil 143 is set as desired.

Although not specifically limited, material of the substrate 140 is a glass plate, a synthetic resin plate, a ceramic plate, a silicon plate, a metal plate or the like having a thickness of several mm.

Material of the sacrificial film 141 is preferably a copper thin film, a copper (Cu)/chrome (Cr) thin film or the like having a thickness of 0.1 to 5.0 $\mu$m If the copper/chrome thin film is to be used as the sacrificial film 141, first chrome is sputtered to form a tight contact layer, and copper is sputtered on this tight contact layer. In this case, for example, a thickness of the chrome thin film is 0.03 $\mu$m and a thickness of the copper thin film is about 0.3 $\mu$m. When the first resist film 142 is formed, not only the opening corresponding to the probe holder but also one or a plurality of positioning holes or small holes may be formed at the same time.

Figure 24B:
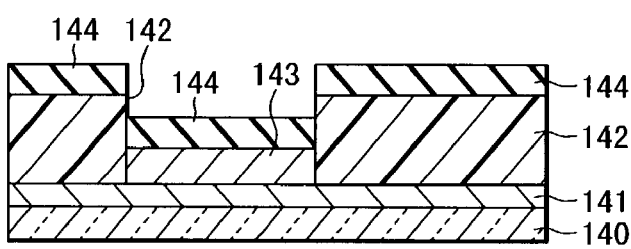
Figure 24B:
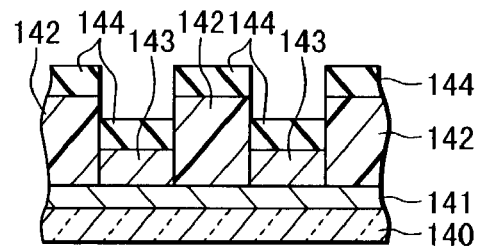

As shown in FIGS. 24BX and 24BY, an insulating film 144 is formed on the surfaces of the first resist film 142 and first metal foil 143. The insulating film 144 may be a silicon dioxide film, an aluminum film or the like having a thickness of about 0.1 to 20 $\mu$m formed by sputtering, CVD or the like. The insulating film 144 is formed in order to electrically insulate the first metal foil 143 and the probe pins to be formed above the first metal foil 143 as will be later described.

Figure 24C:
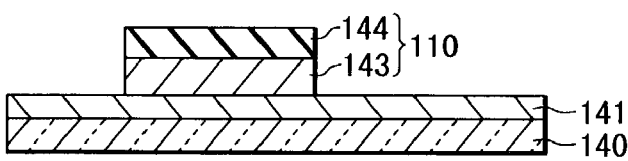
Figure 24C:
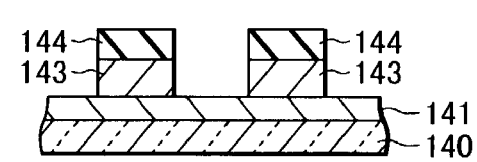

As shown in FIGS. 24CX and 24CY, the first resist film 142 is removed to leave the probe holder 110 on the surface of the sacrificial film 141, the probe holder 110 being constituted of the first metal foil 143 and insulating film 144. In order to remove the first resist film 142, the interface between the first resist film 142 and sacrificial film 141 is washed by N-methyl-2-pyrrolidone. In this case, by immersing the structural body of the substrate 140, first resist film 142 and the like in N-methyl-2-pyrrolidone and performing ultrasonic washing at 85° C., the first resist film 142 can be efficiently removed.

Figure 24D:
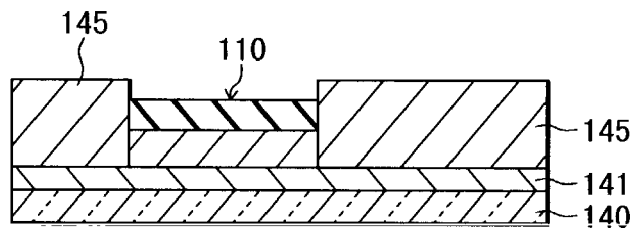
Figure 24D:
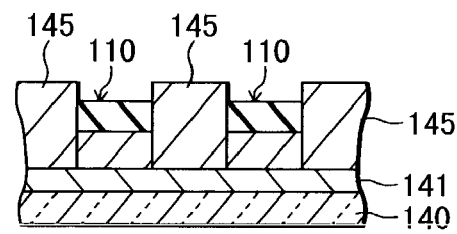

As shown in FIGS. 24DX and 24DY, the whole surface of the sacrificial film 141 with the first resist film 142 being removed, i.e., the whole surface of the sacrificial film 141 not formed with the first metal foil 143, is electroplated with copper to form a plated copper layer 145. A thickness of the plated copper layer 145 is set thicker than the probe holder 110.

Figure 24E:
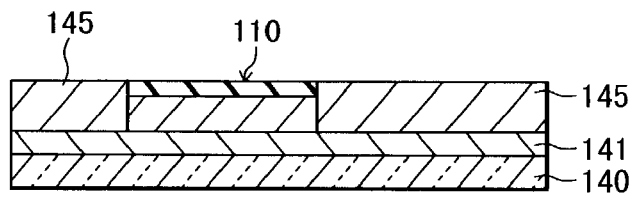
Figure 24E:
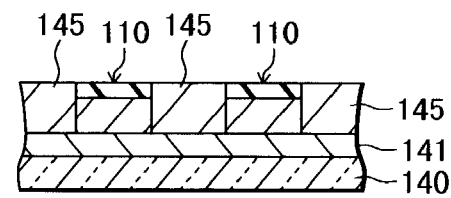
Figure 24F:
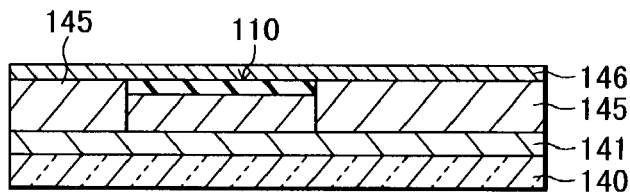
Figure 24F:
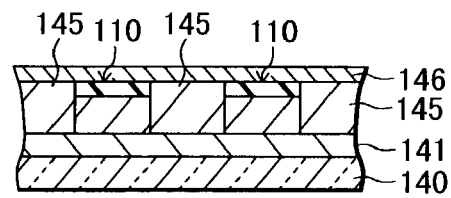

As shown in FIGS. 24EX and 24EY, the plated copper layer 145 is polished to make it flush with the probe holder 110. As shown in FIGS. 24FX and 24FY, an underlying film 146 for the probe unit is formed on the surfaces of the probe holder 110 and plated copper layer 145 by sputtering.

The underlying film 146 is preferably a titanium (Ti)/ nickel (Ni) iron (Fe) thin film or the like having a thickness of about 0.05 to 0.5 $\mu$m. If the titanium/nickel-iron thin film is to be formed as the underlying film 146, first a titanium thin film is formed as a tight contact layer by sputtering, and a nickel iron thin film is formed on the titanium thin film by sputtering. In this case, for example, a thickness of the titanium thin film is 0.02 $\mu$m and a thickness of the nickel-iron thin film is about 0.15 $\mu$m.

Figure 24G:
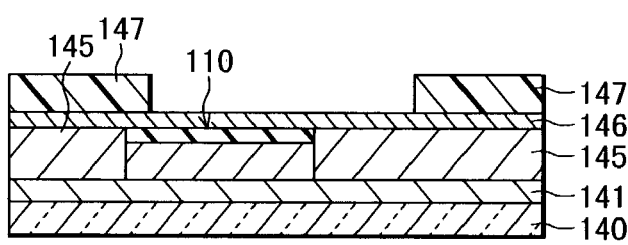
Figure 24G:
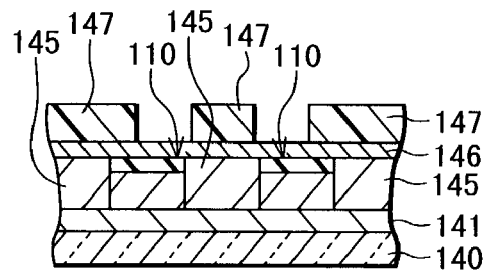

As shown in FIG. 24GX and 24GY, on the surface of the underlying film 146, photoresist is coated to an arbitrary thickness. A mask having a predetermined pattern is disposed on the surface of the photoresist. Exposure and development processes are performed to remove unnecessary photoresist to form a second resist film 147 having openings corresponding to the pattern of the probe pins. A thickness of the second resist film 147 is preferably in the range from 10 to 200 $\mu$m. In addition to the openings corresponding to the pattern of the probe pins, the openings corresponding to the pattern of the positioning members for determining the mount position may be formed at the same time.

Figure 24H:
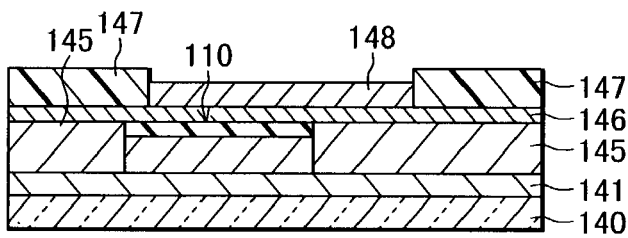
Figure 24H:
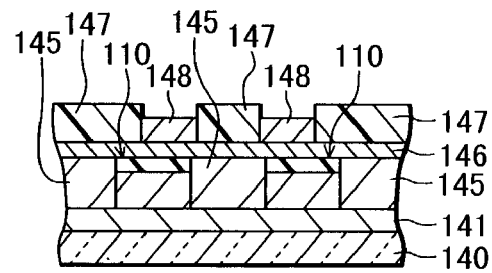

As shown in FIG. 24HX and 24HY, a second nickel alloy metal foil (pattern) 148 is formed on the surface of the underlying film 146 not covered with the second resist film 147, by electroplating using known iron-nickel plating liquid which contains sulfuric acid as main composition. A thickness of the second metal foil (pattern) 148 is set as desired.

Figure 24I:
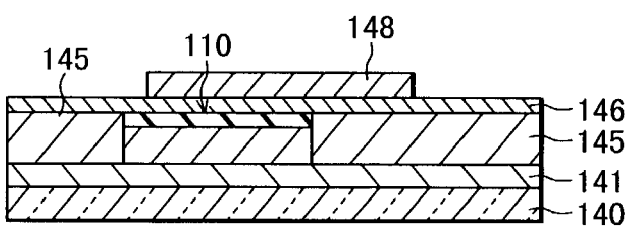
Figure 24I:
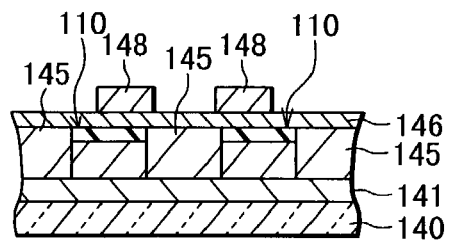

As shown in FIGS. 24IX and 24IY, the second resist film 147 is removed. In order to remove the second resist film 147, the interface between the second resist film 147 and underlying film 146 is washed by N-methyl-2-pyrrolidone. In this case, by immersing the structural body of the substrate 140, second resist film 147 and the like in N-methyl-2-pyrrolidone and performing ultrasonic washing at 85° C., the second resist film 147 can be efficiently removed.

As shown in FIG. 24JX and 24JY, the exposed underlying film 146 is removed by ion milling so that the underlying film 146 and second metal foil (pattern) 148 have the same outer size and the probe pins 22 constituted of the underlying film 146 and second metal foil 248 are left on the probe holder 110.

As shown in FIG. 24KX and 24KY, in order to improve tight contact between the probe holder 110 and probe pins 22 and protect wirings of the probe unit, the region of the probe pins in tight contact with the probe holder 110 is covered with a protective film 32. In this case, photosensitive polyimide, ultraviolet hardening adhesive, cardo type insulating material, photoresist or the like is coated on the region where the probe pins are in tight contact with the probe holder 110 and hardened or a dry film is attached, to thereby form the protective film 32.

As shown in FIGS. 24LX and 24LY, the sacrificial film 141 and plated copper layer 145 are dissolved by using etchant which dissolves copper with a priority over other materials. An integrated part of the probe pins 22 and probe holder 110 is therefore separated from the substrate 140, and a probe unit 10 with the probe pins 22 and probe holder 110 can be formed.

With the ninth method of manufacturing the probe unit, the probe pins 22 and probe holder 110 are formed integrally by using lamination of various thin films without joining the probe pins and probe holder mechanically or with solder or adhesive. It is therefore possible to prevent the probe pins from being damaged. It is also possible to form the probe pins 22 and probe holder 110 at a high precision of relative positions.

Since it is not necessary to physically cut the probe holder 110, the outer size can be determined highly precisely and the probe pins 22 are prevented from being broken during a cutting process.

The positioning holes can be formed through the probe holder 110 by using photoresist at a high precision of position alignment. The probe unit 10 can therefore be mounted on each apparatus in high precision position alignment. It is therefore possible to highly precisely perform conduction tests of liquid crystal display panels and the like.

Since the pattern of the positioning members for determining the mount positions and the probe pins 22 are formed at the same time, the positioning holes can be formed at a high precision so that a precision of relative positions of the probe pins 22 and a test body can be improved.

In this embodiment, although the protective film 32 is formed, the probe unit 10 without the protective film 32 may be formed. Alternatively, after the probe unit 10 is separated from the substrate 140, the protective film 32 may be formed.

In order to shorten the time taken to separate the probe unit 10 from the substrate 140, the substrate 140 may be made of copper without forming the sacrificial film 141. In this case, if the mechanical strength of the copper substrate 140 is insufficient, a solid and stable substrate made of glass, ceramic or the like may be lined with the substrate 140.

Also in this embodiment, after the probe holder 110 is formed, the probe pins 22 are stacked on the probe holder 110. Conversely, after the probe pins 22 are formed, the probe holder 110 may be stacked on the probe pins.

(Tenth Manufacture Method)

FIGS. 25A to 25F are schematic cross sectional views illustrating the tenth method of manufacturing the probe unit. By applying this manufacture method, the probe unit 10 having, for example, one of the ninth to twelfth structures can be manufactured.

Figure 25A:
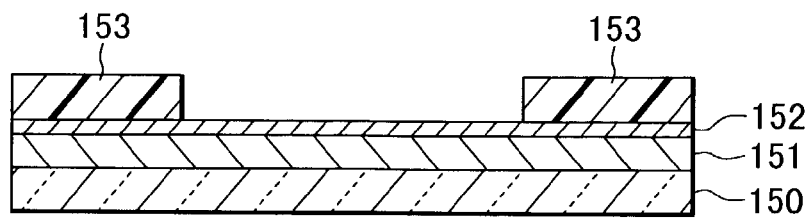
FIGS. 25A to 25F are schematic cross sectional views illustrating a tenth method of manufacturing a probe unit.

In the tenth method of manufacturing the probe unit, first as shown in FIG. 25A, on the surface of a substrate 150 a sacrificial film 151 is formed by sputtering, vacuum deposition, ion plating or the like, preferably by sputtering. On the surface of the sacrificial film 151, an underlying film 152 for the probe unit is formed by sputtering. On the surface of the underlying film 152, photoresist is coated to an arbitrary thickness. A mask having a predetermined pattern is disposed on the surface of the photoresist. Exposure and development processes are performed to remove unnecessary photoresist to form a resist film 153 having openings corresponding to the pattern of probe pins.

Since the pattern of the positioning members for determining the mount positions and the probe pin pattern can be formed at the same time, the positioning holes can be formed at a high precision and a precision of relative positions of the probe pins and a test body can be improved.

Although not specifically limited, material of the substrate 150 is a glass plate, a synthetic resin plate, a ceramic plate, a silicon plate, a metal plate or the like having a thickness of several mm.

Material of the sacrificial film 151 is preferably a copper thin film, a copper (Cu)/chrome (Cr) thin film or the like having a thickness of 0.1 to 5.0 $\mu$m. If the copper/chrome thin film is to be used as the sacrificial film 151, first chrome is sputtered to form a tight contact layer, and copper is sputtered on this tight contact layer. In this case, for example, a thickness of the chrome thin film is 0.03 $\mu$m and a thickness of the copper thin film is about 0.3 $\mu$m.

The underlying film 152 is preferably a titanium (Ti)/nickel (Ni)-iron (Fe) thin film or the like having a thickness of about 0.05 to 0.5 $\mu$m. If the titanium/nickel-iron thin film is to be formed as the underlying film 152, first a titanium thin film is formed as a tight contact layer by sputtering, and a nickel iron thin film is formed on the titanium thin film by sputtering. In this case, for example, a thickness of the titanium thin film is 0.02 $\mu$m and a thickness of the nickel-iron thin film is about 0.15 $\mu$m.

The underlying film 152 is used because if a resist film of photoresist to be later described is formed directly on the sacrificial film 151, a resist film having a high resolution cannot be obtained. Since the underlying film 152 has good wettability with photoresist, a resist film having a high resolution and a desired shape can be formed on the sacrificial film 151. Depending upon the kind of photoresist, the underlying film 152 may be omitted.

The resist film 153 preferably has a thickness of 10 to 200 $\mu$m.

Since the resist film 153 of photoresist is used, patterns of the leads constituting the probe pins can be formed in parallel at a narrow pitch. Similarly, the probe pins and probe holder can be formed at a high precision of relative positions. The positioning holes can also be formed at a high precision of position alignment.

Figure 25B:
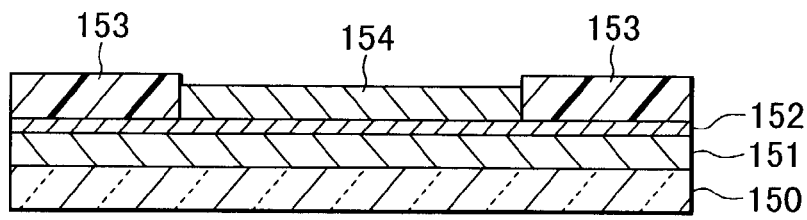

As shown in FIG. 25B, a nickel alloy metal foil (pattern) 154 for probe pins is formed on the surface of the underlying film 152 not covered with the resist film 153, by electroplating using known iron-nickel plating liquid which contains sulfuric acid as main composition. A thickness of the metal foil (pattern) 154 is set as desired.

Figure 25C:
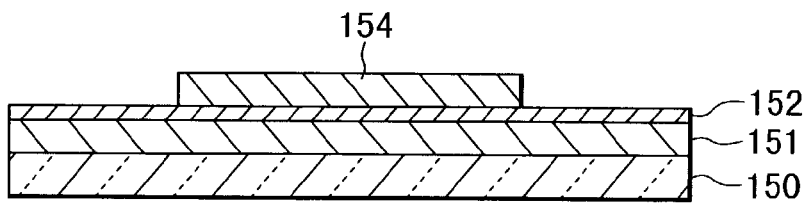

As shown in FIG. 25C, the resist film 153 is removed. In order to remove the first resist film 153, the interface between the first resist film 153 and underlying film 152 is washed by N-methyl-2-pyrrolidone. In this case, by immersing the structural body of the substrate 150, resist film 153 and the like in N-methyl-2-pyrrolidone and performing ultrasonic washing at 85° C., the first resist film 153 can be efficiently removed.

Figure 25D:
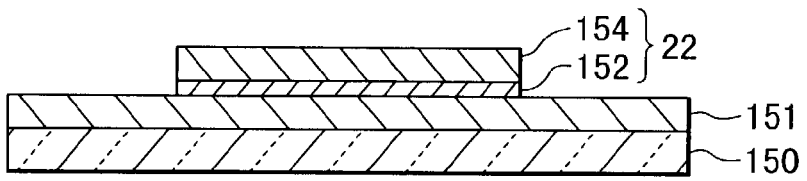

As shown in FIG. 25D, the exposed underlying film 152 is removed by ion milling so that the underlying film 152 and metal foil (pattern) 154 have the same outer size and the probe pins 22 constituted of the underlying film 152 and metal foil 154 are left on the surface of the sacrificial film 151.

Figure 25E:
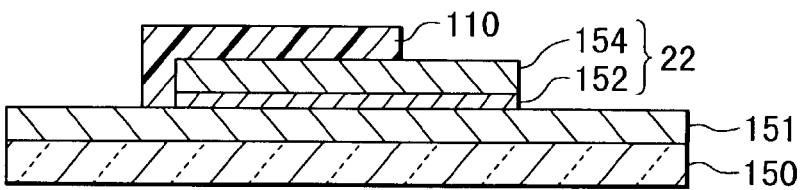

As shown in FIG. 25E, a probe holder 110 is formed in the region where the underlying film 152 and metal foil 154 are in tight contact with each other, by coating photosensitive polyimide, ultraviolet hardening adhesive, cardo type insulating material, photoresist or the like, or by attaching a dry film.

Photoresist is preferably used. The probe holder 110 either partially covers the probe pins 22 or completely covers the probe pins 22 to be embedded in the probe holder 110. The probe holder 110 also functions as the protective film of in the probe pins.

In forming the probe holder 110 by using photoresist, photoresist is coated over the probe pins 22 to a desired thickness. A mask having a predetermined pattern is disposed on the surface of photoresist. Exposure and development processes are performed to remove unnecessary photoresist and form a desired probe holder outer shape. In addition to the outer shape of the probe holder, one or a plurality of positions holes or small holes may be formed at the same time through the probe holder 110.

Figure 25F:
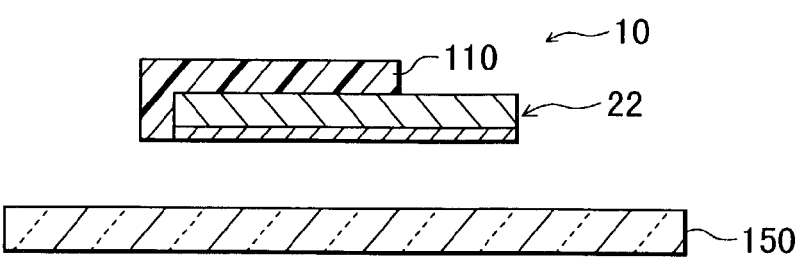

As shown in FIG. 25F, the sacrificial film 151 is dissolved by using etchant which dissolves copper with a priority over other materials. An integrated part of the probe pins 22 and probe holder 110 is therefore separated from the substrate 150, and a probe unit 10 with the probe pins 22 and probe holder 110 can be formed.

With the tenth method of manufacturing the probe unit, the probe pins 22 and probe holder 110 are formed integrally by using lamination of various thin films without joining the probe pins and probe holder mechanically or with solder or adhesive. It is therefore possible to prevent the probe pins 22 from being damaged.

It is also possible to form the probe pins 22 and probe holder 110 at a high precision of relative positions.

Since the probe holder 110 is formed by using photoresist, the positioning holes can be formed at a high precision of position alignment. The probe unit 10 can therefore be mounted on each apparatus in high precision position alignment. It is therefore possible to highly precisely perform conduction tests of liquid crystal display panels and the like.

Since the pattern of the positioning members for determining the mount positions and the probe pins 22 are formed at the same time, the positioning holes can be formed at a high precision so that a precision of relative positions of the probe pins 22 and a test body can be improved.

In order to shorten the time taken to separate the probe unit 10 from the substrate 150, the substrate 150 may made of copper without forming the sacrificial film 151. In this case, if the mechanical strength of the copper substrate 150 is insufficient, a solid and stable substrate made of glass, ceramic or the like may be lined with the substrate 150.

Figure 26:
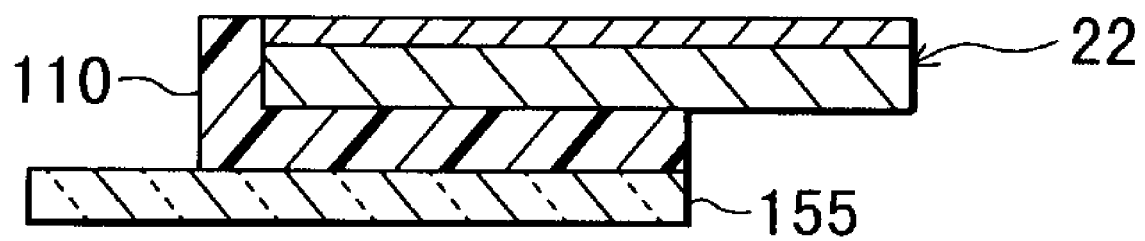
FIG. 26 is a schematic cross sectional view illustrating a modification of the tenth method of manufacturing a probe unit.

If the probe holder 110 is made of resin, the probe holder 110 may be expanded or contracted by a temperature change so that a high size precision cannot be obtained. In such a case, as shown in FIG. 26, a holder plate 155 made of material hard to be expanded or contracted by a temperature change, such as ceramic, quartz and silicon, may be fixed to the probe holder 110 with adhesive.

(Eleventh Manufacture Method)

Figure 27A:
FIGS. 27A to 27Q are schematic cross sectional views illustrating an eleventh method of manufacturing a probe unit.
Figure 27B:
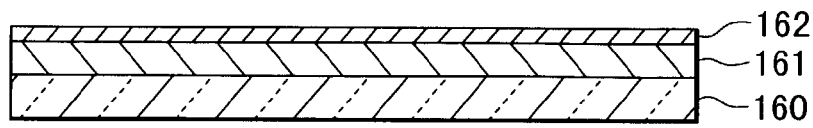
Figure 27C:
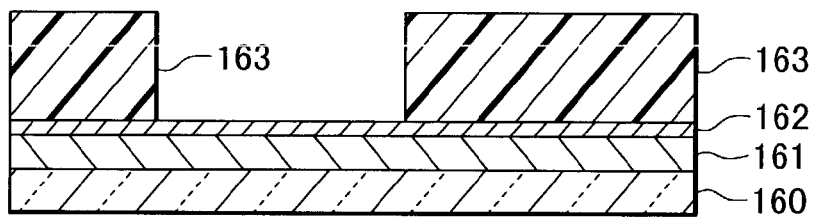
Figure 27D:
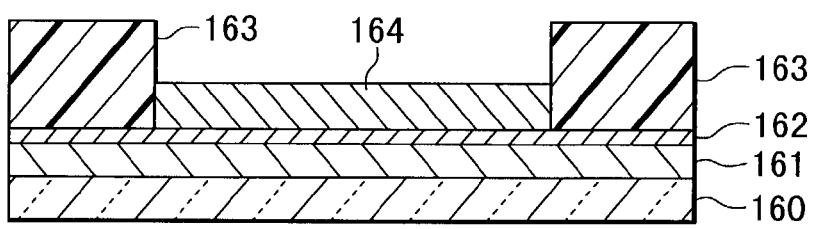
Figure 27E:
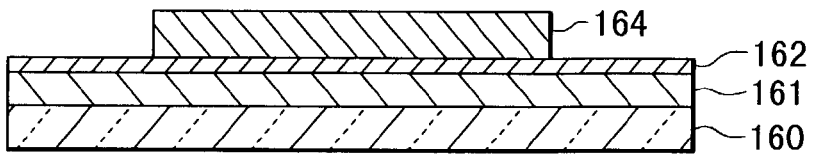
Figure 27F:
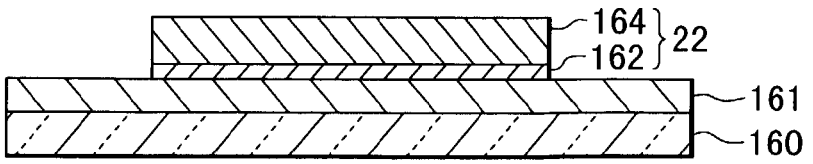
Figure 27G:
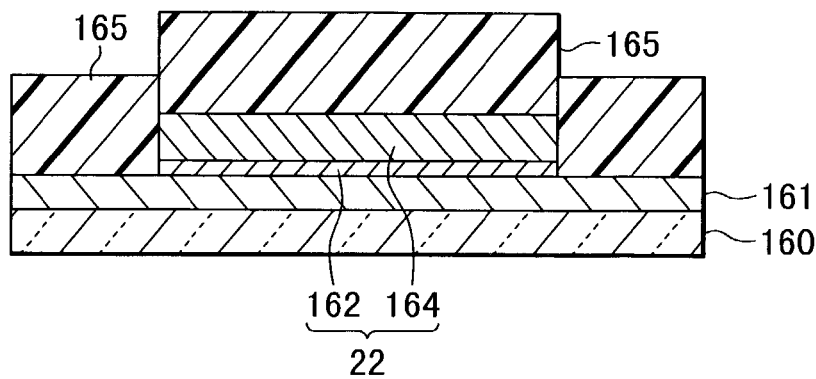
Figure 27H:
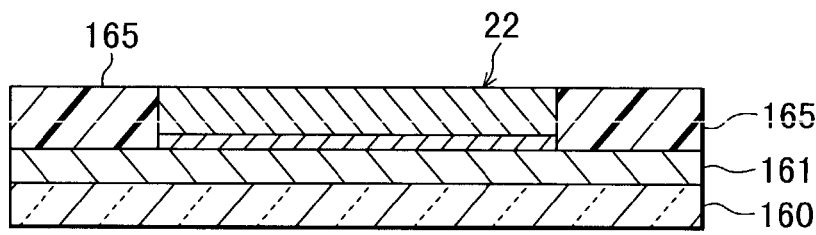
Figure 27I:
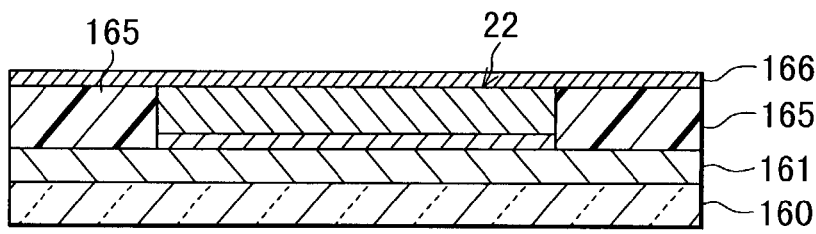
Figure 27J:
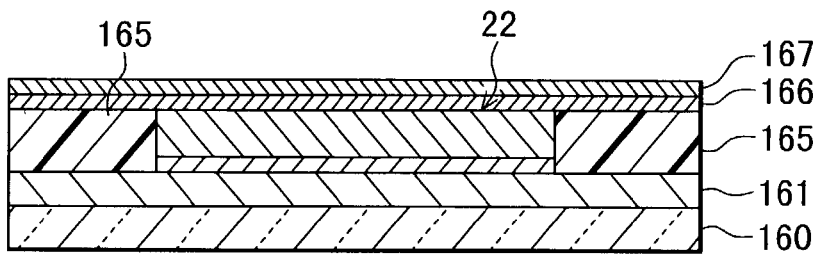
Figure 27K:
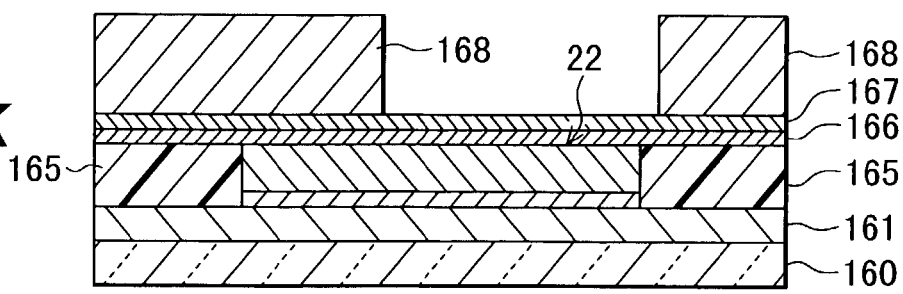
Figure 27L:
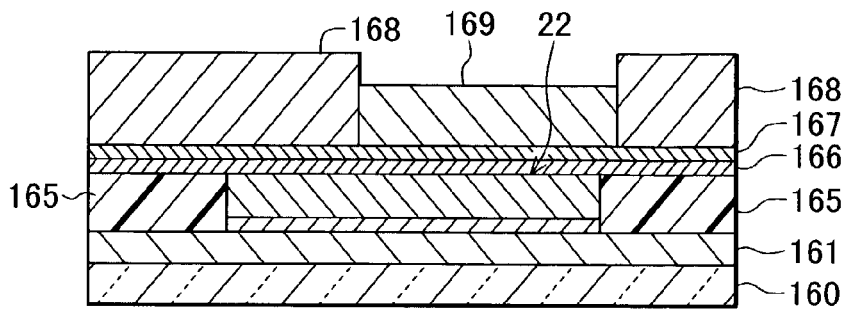
Figure 27M:
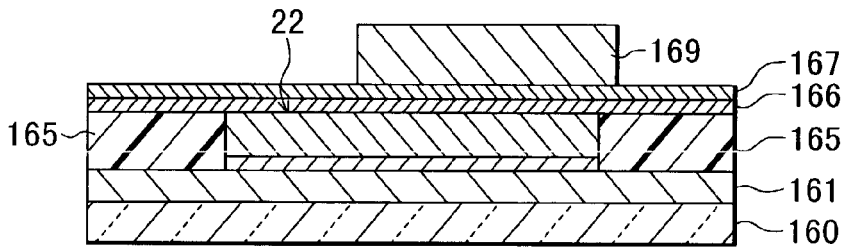
Figure 27N:
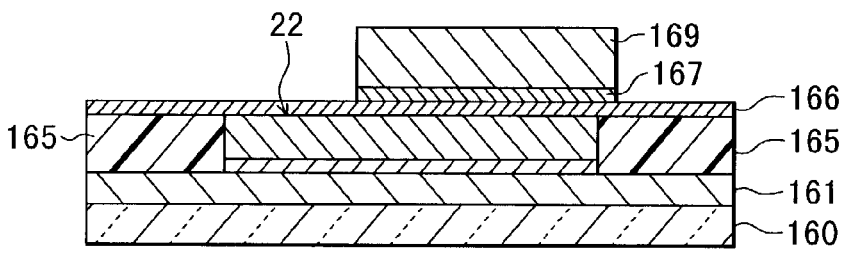
Figure 27P:
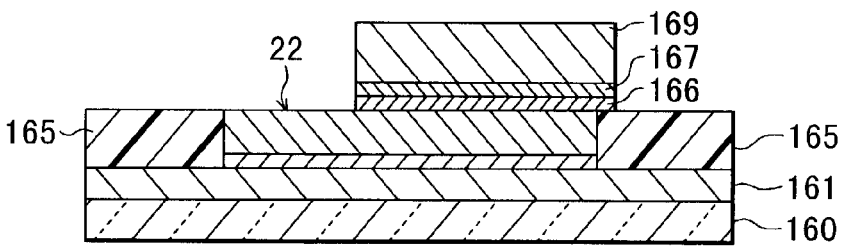
Figure 27Q:
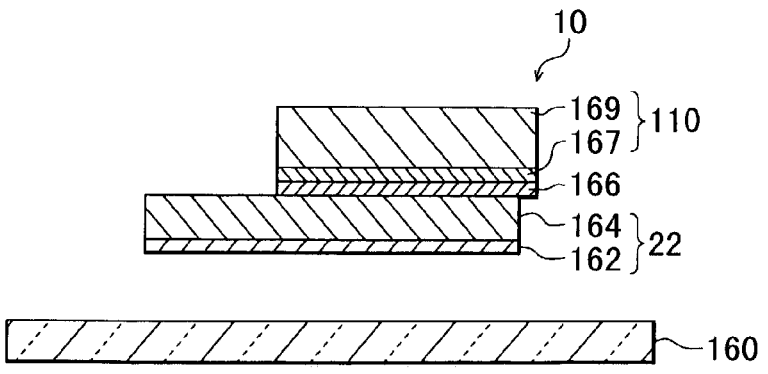

FIGS. 27A to 27Q are schematic cross sectional views illustrating the eleventh method of manufacturing the probe unit. By applying this manufacture method, the probe unit 10 having, for example, the thirteenth structure can be manufactured.

In the thirteenth method of manufacturing the probe unit, first as shown in FIG. 27A, on the surface of a substrate 160 a sacrificial film 161 is formed by sputtering, vacuum deposition, ion plating or the like, preferably by sputtering.

Although not specifically limited, material of the substrate 160 is a glass plate, a synthetic resin plate, a ceramic plate, a silicon plate, a metal plate or the like having a thickness of several mm.

Material of the sacrificial film 161 is preferably a copper thin film, a copper (Cu)/chrome (Cr) thin film or the like having a thickness of 0.1 to 5.0 µm. If the copper/chrome thin film is to be used as the sacrificial film 151, first chrome is sputtered to form a tight contact layer, and copper is sputtered on this tight contact layer. In this case, for example, a thickness of the chrome thin film is 0.03 µm and a thickness of the copper thin film is about 0.3 µm.

As shown in FIG. 27B, on the surface of the sacrificial film 161, a first underlying film 162 for the probe pins is formed by sputtering.

The first underlying film 162 is preferably a titanium (Ti)/nickel (Ni)-iron (Fe) thin film or the like having a thickness of about 0.05 to 0.5 µm. If the titanium/nickel-iron thin film is to be formed as the underlying film 162, first a titanium thin film is formed as a tight contact layer by sputtering, and a nickel iron thin film is formed on the titanium thin film by sputtering. In this case, for example, a thickness of the titanium thin film is 0.02 µm and a thickness of the nickel-iron thin film is about 0.15 µm.

The first underlying film 162 is used because if a resist film of photoresist to be later described is formed directly on the sacrificial film 161, a resist film having a high resolution cannot be obtained. Depending upon the kind of photoresist, the first underlying film 162 may be omitted.

As shown in FIG. 27C, on the surface of the first underlying film 162, photoresist is coated to a desired thickness. A mask having a predetermined pattern is disposed on the surface of photoresist. Exposure and development processes are performed to remove unnecessary photoresist and form a first resist film 163 having openings corresponding to the probe patterns. The first resist film 163 preferably has a thickness of 10 to 200 µm.

When the first resist film 163 is formed, in addition to the pattern corresponding to the probe pins, the pattern corresponding to one or a plurality of frames for determining the position of the probe unit, one or a plurality of positioning holes and small holes may be formed at the same time.

As shown in FIG. 27D, a first nickel alloy metal foil (pattern) 164 to be used as probe pins and positioning members are formed on the surface of the underlying film 162 not covered with the first resist film 163, by electroplating using known iron-nickel plating liquid which contains sulfuric acid as main composition. A thickness of the first metal foil (pattern) 164 is set as desired.

As shown in FIG. 27E, the first resist film 163 is removed. In order to remove the first resist film 163, the interface between the first resist film 163 and first underlying film 162 is washed by N-methyl-2-pyrrolidone. In this case, by immersing the structural body of the substrate 160, resist film 163 and the like in N-methyl-2-pyrrolidone and performing ultrasonic washing at 85° C., the first resist film 163 can be efficiently removed.

As shown in FIG. 27F, the exposed underlying film 162 is removed by ion milling so that the first underlying film 162 and first metal foil 164 have the same outer size and the probe pins 22 constituted of the first underlying film 162 and first metal foil 164 are left on the surface of the sacrificial film 161.

As shown in FIG. 27G, the surfaces of the sacrificial film 161 and probe pins 22 are covered with a plated copper layer 165. In this case, the plated copper layer 165 is formed excessively so that the whole surfaces of the sacrificial film 161 and probe pins 22 can be completely covered.

As shown if FIG. 27H, the plated copper layer 165 is polished with diamond slurry to make the upper surface of the plated copper layer 165 be flush with the probe pins 22.

As shown in FIG. 27I, an insulating film 166 is formed on the surfaces of the probe pins 22 and plated copper layer 165. The insulating film 166 may be a silicon dioxide film, an aluminum film or the like having a thickness of about 0.1 to 20 µm formed by sputtering, CVD or the like. The insulating film 166 is formed in order to electrically insulate the probe pins 22 and a probe holder to be formed on the probe pins 22 as will be described later.

As shown in FIG. 27J, on the surface of the insulating film 166, a second underlying film 167 for the probe holder is formed by sputtering. The second underlying film 167 is made of material similar to that of the first underlying film 162.

As shown in FIG. 27K, on the surface of the second underlying film 167, photoresist is coated to an arbitrary thickness. A mask having a predetermined pattern is disposed on the surface of the photoresist. Exposure and development processes are performed to remove unnecessary photoresist to form a second resist film 168 having an opening corresponding to the probe holder pattern. A thickness of the second resist film 168 is preferably in the range from 10 to 200 µm. In addition to the opening corresponding to the probe holder pattern, the openings corresponding to the pattern of one or a plurality of frame patterns for determining the position of the probe unit, one or a plurality of positioning holes and small holes may be formed at the same time.

Photoresist used as the second resist film 168 may be similar photoresist to that used as the first resist film 163.

As shown is FIG. 27L, a second nickel alloy metal foil 169 for the probe holder is formed on the surface of the second underlying film 167 not covered with the second resist film 168, by electroplating using known iron nickel plating liquid which contains sulfuric acid as main composition. A thickness of the second metal foil 169 is set as desired.

As shown in FIG. 27M, the second resist film 168 is removed. In order to remove the second resist film 168, the interface between the second resist film 168 and second underlying film 167 is washed by N-methyl-2-pyrrolidone. In this case, by immersing the structural body of the substrate 160, second resist film 168 and the like in N-methyl-2-pyrrolidone and performing ultrasonic washing at 85° C., the second resist film 168 can be efficiently removed.

As shown in FIG. 27N, the exposed second underlying film 167 is removed by ion milling so that the second underlying film 167 and second metal foil 169 have the same outer size.

As shown in FIG. 27P, the exposed insulating film 166 is removed by ion etching so that the insulating film 166 and second metal foil 169 have the same outer size and a probe holder 110 constituted of the insulating film 166 and second metal foil 169 is obtained.

As shown in FIG. 27Q, the sacrificial film 161 and plated copper layer 165 are dissolved by using etchant which dissolves copper with a priority over other materials. An integrated part of the probe pins 22 and probe holder 110 is therefore separated from the substrate 160, and a probe unit 10 with the probe pins 22 and probe holder 110 can be formed.

With the eleventh method of manufacturing the probe unit, the probe pins 22 and probe holder 110 are formed integrally by using lamination of various thin films without joining the probe pins and probe holder mechanically or with solder or adhesive. It is therefore possible to prevent the probe pins 22 from being damaged.

It is also possible to form the probe pins 22 and probe holder 110 at a high precision of relative positions.

Since the probe pins 22 and probe holder 110 are formed by using photoresist, the positioning frames, positioning holes and small holes can be formed at a high precision of position alignment. The probe unit 10 can therefore be mounted on each apparatus in high precision position alignment. It is therefore possible to highly precisely perform conduction tests of liquid crystal display panels and the like.

Since the pattern of the positioning members including the frames, positioning holes and small holes and the probe pins 22 can be formed at the same time, a precision of relative positions of the probe pins 22 and a test body can be improved.

The probe unit and its manufacture method have been described in conjunction with the preferred embodiments.

If a plurality of small holes are formed through the probe holder, etching the probe unit can be performed highly efficiently.

If the probe unit is formed in the frame defined by photoresist through electroplating, a thickness of the probe holder is uniform. In addition, the positioning members including the positioning holes, positioning frames formed through and on the probe holder as well as the small holes can be disposed in a high position alignment precision.

If an insulating film is formed on the surface of the probe holder formed through electroplating and the probe pins are to be formed on the surface of the insulating film by using photoresist, the probe pin pattern having a high resolution can be formed so that the probe pins can be formed highly precisely.

If the probe holder and probe pins are covered with a protective film, tight contact between the probe folder and probe pins can be improved and wirings of the probe unit can be protected.

If the probe pins are formed on the probe holder formed by electroplating, by using the same or generally the same material as that of the probe holder, e.g., by the same alloy, contact between the probe holder and probe pins can be improved and the probe pins and probe holder can be disposed at a high precision of relative positions.

If the probe pins formed by electroplating are embedded in the probe holder made of resin, the probe pins in an integral part of the probe pins and probe holder cannot be damaged. In addition, the probe pins and probe holder can be formed and joined at a high precision of relative positions.

FIG. 28 is a front view illustrating how a probe unit manufactured by the embodiment method is used. In FIG. 28, a probe unit 10 having the seventh structure shown in FIGS. 9A and 9B is illustratively shown.

The probe holder 110 of the probe unit 10 is adhered to a junction surface 100a of a holder 100 of a conduction test apparatus not shown. The probe unit 10 is electrically connected to an electronic circuit of the conduction test apparatus via electrodes (not shown) of the flexible wiring flat cable 3.

In order to adhere the probe unit 10 to the holder 100, positioning pins 101 mounted vertically to the junction surface of the holder 100 and formed with threads at the top portions of the pins 101 are inserted into the positioning holes 111 formed through the probe holder 110, and fixing jigs 102 such as nuts are threaded with the pins.

A conduction test is performed by pushing the tips of the probe pins 22 of the probe unit 10 to electrodes of a test body (to be measured) 110 such as a liquid crystal display panel placed on a test body base (sample base) 103 made of insulating material.

The present invention has been described in connection with the preferred embodiments. The invention is not limited only to the above embodiments. It is apparent that various modifications, improvements, combinations, and the like can be made by those skilled in the art.

What we claim are:

1. A probe unit to be fixed to a probe device for testing functions of a test body, comprising:
    a substrate having a principal surface and an edge;
    a plurality of leads formed on said substrate, each of said leads having a first end fixed to said principal surface of said substrate and a second end protruded outwardly from said edge of said substrate, wherein said second ends constitute probe pins arranged parallel to each other, so as to be capable of being brought into contact with electrodes of the test body; and
    a positioning member formed on said substrate at a predetermined position relative to said probe pins, said positioning member being adapted for abutting upon a member for positioning said substrate relative to the probe device.

2. A probe unit according to claim 1, wherein said positioning member has the inner clip washer shape that elastic protrusions extend circumferentially around a through hole formed through said substrate.

3. A probe unit according to claim 1, further comprising a reinforcing film fixed to said substrate and covering a region of said probe pins on said substrate and/or at least a region of said positioning member.

4. A probe unit according to claim 1, wherein said probe pins and said positioning member are made of a same material and have a same film thickness.

5. A probe unit to be fixed to a probe device for testing functions of a test body, comprising:
    an array of probe pins, each including an underlying film and a probe pin pattern formed on the underlying film; and
    a probe holder formed on said array of probe pins, said probe holder having a plurality of through holes, wherein one end portion of each probe pin is covered by said probe holder and the other end portion of each probe pin extends from an edged portion of said probe holder.

6. A probe unit according to claim 5, wherein said probe holder has an insulating film formed on the top surface of said array of probe pins.

7. A probe unit according to claim 5, further comprising a protective film covering said probe holder and said array of probe pins.

8. A probe unit according to claim 6, wherein said probe holder excepting the insulating film is made of a same material as a material of said array of probe pins.

9. A probe unit according to claim 5, wherein said probe holder covers said array of probe pins.

* * * * *